(12) United States Patent
Miyanaga et al.

(10) Patent No.: US 11,316,082 B2
(45) Date of Patent: Apr. 26, 2022

(54) WAVELENGTH CONVERTING MEMBER AND METHOD OF PRODUCING THE SAME

(71) Applicant: NS MATERIALS INC., Fukuoka (JP)

(72) Inventors: Akiharu Miyanaga, Fukuoka (JP); Eiichi Kanaumi, Fukuoka (JP)

(73) Assignee: NS MATERIALS INC., Fukuoka (JP)

( * ) Notice: Subject to any disclaimer, the term of this patent is extended or adjusted under 35 U.S.C. 154(b) by 0 days.

(21) Appl. No.: 16/566,953

(22) Filed: Sep. 11, 2019

(65) Prior Publication Data
US 2020/0006604 A1 Jan. 2, 2020

Related U.S. Application Data

(62) Division of application No. 15/538,253, filed as application No. PCT/JP2015/085632 on Dec. 21, 2015.

(30) Foreign Application Priority Data

Dec. 26, 2014 (JP) .................. 2014-263785

(51) Int. Cl.
*H01L 33/50* (2010.01)
*B82Y 20/00* (2011.01)
*H01L 33/64* (2010.01)

(52) U.S. Cl.
CPC ............ *H01L 33/508* (2013.01); *B82Y 20/00* (2013.01); *H01L 33/50* (2013.01); *H01L 33/502* (2013.01); *H01L 33/504* (2013.01); *H01L 33/648* (2013.01); *H01L 2924/0001* (2013.01)

(58) Field of Classification Search
CPC .................. H01L 33/50–508; B82Y 20/00
USPC .................................................. 427/162–169
See application file for complete search history.

(56) References Cited

U.S. PATENT DOCUMENTS

| | | | |
|---|---|---|---|
| 6,251,303 B1 | 6/2001 | Bawendi et al. | |
| 6,413,645 B1* | 7/2002 | Graff | B32B 27/00 426/126 |
| 2004/0129946 A1 | 7/2004 | Nagai et al. | |
| 2007/0077685 A1 | 4/2007 | Noda et al. | |
| 2007/0246734 A1 | 10/2007 | Lee et al. | |
| 2008/0216894 A1 | 9/2008 | Hammond | |

(Continued)

FOREIGN PATENT DOCUMENTS

| | | |
|---|---|---|
| JP | 2004-140185 | 5/2004 |
| JP | 2007-152847 | 6/2007 |

(Continued)

OTHER PUBLICATIONS

Office Action from United States Patent and Trademark Office (USPTO) in U.S. Appl. No. 16/566,950, dated Oct. 25, 2019.

(Continued)

*Primary Examiner* — Elizabeth A Burkhart
(74) *Attorney, Agent, or Firm* — Greenblum & Bernstein, P.L.C.

(57) ABSTRACT

A method of producing a wavelength converting member is provided. The method includes forming a quantum dot layer on a bottom organic layer, and forming a top organic layer on the quantum dot layer. The quantum dot layer includes quantum dots. A moisture vapor transmission rate of the top organic layer and the bottom organic layer is at least 0.006 $g/(m^2 \cdot day)$ and less than 9 $g/(m^2 \cdot day)$.

20 Claims, 22 Drawing Sheets

(56) References Cited

U.S. PATENT DOCUMENTS

| | | |
|---|---|---|
| 2009/0202747 A1 | 8/2009 | Yukinobu et al. |
| 2010/0164346 A1 | 7/2010 | Li et al. |
| 2010/0238381 A1 | 9/2010 | Oshima et al. |
| 2010/0283036 A1* | 11/2010 | Coe-Sullivan ...... H01L 51/5088 257/13 |
| 2011/0052892 A1 | 3/2011 | Murakami |
| 2011/0273864 A1 | 11/2011 | Izawa |
| 2011/0303940 A1 | 12/2011 | Lee et al. |
| 2011/0309325 A1 | 12/2011 | Park et al. |
| 2012/0113672 A1 | 5/2012 | Dubrow et al. |
| 2013/0078469 A1* | 3/2013 | Winter ............... B01J 13/04 428/402.24 |
| 2013/0088853 A1 | 4/2013 | Kingsley et al. |
| 2013/0121009 A1 | 5/2013 | Tsutsumi et al. |
| 2013/0320834 A1 | 12/2013 | Ulasyuk |
| 2013/0334557 A1 | 12/2013 | Uchida et al. |
| 2014/0021503 A1 | 1/2014 | Yoshida et al. |
| 2014/0043790 A1 | 2/2014 | Hyun et al. |
| 2014/0050864 A1* | 2/2014 | Kihara ............... H01L 31/18 427/579 |
| 2014/0097461 A1 | 4/2014 | Ito et al. |
| 2014/0153280 A1 | 6/2014 | Lee |
| 2014/0302627 A1* | 10/2014 | Ko ................. H01L 51/502 438/35 |
| 2014/0346473 A1 | 11/2014 | Park et al. |
| 2015/0047765 A1 | 2/2015 | Vo et al. |
| 2015/0085490 A1 | 3/2015 | Miller et al. |
| 2015/0166884 A1* | 6/2015 | Hefner, Jr. ........ C09K 11/025 313/512 |
| 2015/0171290 A1 | 6/2015 | Lee et al. |
| 2015/0192273 A1 | 7/2015 | Hikmet et al. |
| 2015/0330602 A1* | 11/2015 | Yonemoto ........ G02B 6/005 349/71 |
| 2015/0357599 A1 | 12/2015 | Kawakami et al. |
| 2015/0368553 A1 | 12/2015 | Nelson et al. |
| 2016/0011506 A1 | 1/2016 | Gu et al. |
| 2016/0149091 A1 | 5/2016 | Kondo |
| 2017/0022412 A1 | 1/2017 | Qiu |
| 2017/0096538 A1 | 4/2017 | Sasaki |
| 2017/0158925 A1* | 6/2017 | Pieper ............... B32B 27/38 |
| 2017/0248748 A1 | 8/2017 | Satake et al. |
| 2018/0282617 A1 | 10/2018 | Qiu et al. |
| 2019/0055467 A1 | 2/2019 | Ota et al. |

FOREIGN PATENT DOCUMENTS

| | | |
|---|---|---|
| JP | 2007-281484 | 10/2007 |
| JP | 2010-199105 | 9/2010 |
| JP | 2010-225373 | 10/2010 |
| JP | 2011-51220 | 3/2011 |
| JP | 2011-258951 | 12/2011 |
| JP | 2012-004567 | 1/2012 |
| JP | 2013-105877 | 5/2013 |
| JP | 2013-544018 | 12/2013 |
| JP | 2014-159124 | 9/2014 |
| KR | 2012-0113128 | 10/2012 |
| KR | 2013/0009027 | 1/2013 |
| KR | 10-2013-0115771 | 10/2013 |
| TW | 201103172 | 1/2011 |
| TW | 201413348 | 4/2014 |
| TW | 201445793 | 12/2014 |
| WO | 2012/064562 | 5/2012 |
| WO | 2012/102107 | 8/2012 |
| WO | 2012/132232 | 10/2012 |
| WO | 2014/006597 | 1/2014 |
| WO | 2014/028677 | 2/2014 |
| WO | 2014/113562 | 7/2014 |
| WO | WO 2014/113562 * | 7/2014 |
| WO | WO2015013225 * | 1/2015 |
| WO | 2015/153148 | 10/2015 |

OTHER PUBLICATIONS

English Translation of Office Action from Korean Intellectual Property Office in Korean Pat. Appl. No. 10-2017-7018866, dated Dec. 4, 2019.

John Van Derlofske et al., "Quantum dot film lets LCDs express 50% more color", Laser Focus World, Apr. 2014, pp. 39-42.

International Search Report, along with English-language translation thereof, issued in PCT/JP2015/085632 dated Jan. 26, 2016.

Official Action, along with English-language translation thereof, issued in JP Appl. No. 2016-509796 dated Aug. 1, 2017.

John Van Derlofske et al, "Advances in Displays: Quantum dot film lets LCDs express 50% more color", Laser Focus World, dated Jul. 4, 2014, XP055483079.

Official Communication issued in European Patent Office (EPO) Patent Application No. 15872969.9, dated Jul. 12, 2018.

McCormick, Barrier Films and Adhesives for OLED Solid State Lighting, Department of Energy (DOE) Solid-State Lighting (SSL) R&D Workshop, Jan. 2014, retrieved from "https://www1.eere.energy.gov/buildings/publications/pdfs/ssl/mccormick_barriers_tampa2014.pdf" Year: 2014).

Extended European Search Report from European Patent Office (EPO) in European Patent Appl. No. 20155097.7, dated Apr. 2, 2020.

BYK Additives & Instruments, Technical Information L-Wl 1, Wetting and Dispersing Additives, Nov. 2007. (Year: 2007).

SpecialChem Product News, BYK Unveils DISPERBYK (RTM)-2152 Wetting & Dispersing Agent for Epoxy & Reactive Coatings, Nov. 19, 2012, retrieved from: https://coatings.specialchem.com/ on Nov. 26, 2018. (Year: 2012).

BYK Additives & Instruments, Product Guide L-G 1, Paint Additives, Feb. 2009. (Year: 2009).

CERAMIS (RTNI) CPT-002 Product Data Sheet, celplast metallized products, Mar. 2013. (Year: 2013).

CERAMIS (RTNI) CPT-005 Product Data Sheet, celplast metallized products, Mar. 2013. (Year: 2013).

* cited by examiner

WAVELENGTH CONVERTING MEMBER AND METHOD OF PRODUCING THE SAME

CROSS-REFERENCE TO RELATED APPLICATION

The present application is a divisional application of U.S. patent application Ser. No. 15/538,253, filed Jun. 21, 2017, which is a National Stage Entry of International Patent Application No. PCT/JP2015/085632, filed Dec. 21, 2015, which claims the benefit of Japanese Patent Application No. 2014-263785, filed Dec. 26, 2014. The entire disclosure of each of the above-identified applications, including the specification, drawings, and claims, is incorporated herein by reference in its entirety.

TECHNICAL FIELD

The present invention relates to a wavelength converting member used for a back light etc. and to a method of producing the same.

BACKGROUND ART

For example, JP 2013-544018 A (PTL 1) below discloses an invention relating to quantum dot films and lighting devices using the same.

For example, PTL 1 discloses in FIG. 6A, a lighting device 600 having a QD (quantum dot) phosphor material 604 and barrier layers 620 and 622 placed on both sides of the material. The barrier layers are provided, thereby ensuring the photostability of QDs and protecting the QDs from elevated temperatures, moisture, and other harmful environmental conditions (see [0072] etc. of PTL 1).

CITATION LIST

Patent Literature

PTL 1: JP 2013-544018 A

SUMMARY OF INVENTION

Technical Problem

However, the invention according to PTL 1 does not refer in particular to the relationship between the structure of the barrier layers and change in the light emission intensity over time. In other words, PTL 1 does not limit the structure of the barrier layers in terms of change in the light emission intensity over time.

The present invention is made in consideration of the above, in particular with a view to providing a wavelength converting member which can reduce change in the light emission intensity over time as compared with conventional members and a method of producing the wavelength converting member.

Solution to Problem

A wavelength converting member according to the present invention includes a quantum dot layer having quantum dots; and at least one barrier layer formed on at least both sides of the quantum dot layer. The moisture vapor transmission rate of the barrier layer is lower than 9 g/(m$^2$·d).

Thus, change in the light emission intensity over time can be effectively inhibited as compared with conventional techniques.

In the present invention, the moisture vapor transmission rate is preferably 0.1 g/(m$^2$·d) or less.

Further, in the present invention, the barrier layer is preferably formed around the entire periphery of the quantum dot layer.

Preferably, in the present invention, a wrap starting end and a wrap finishing end of the barrier layer are joined at edge on one side of the quantum dot layer.

Preferably, in the present invention, barrier layers are placed on both the top and bottom of the quantum dot layer and are joined at edges on sides of the quantum dot layer.

Further, in the present invention, the quantum dot layer is preferably formed from a molding or formed by inkjet printing.

Further, in the present invention, the barrier layer is preferably formed to have at least an organic layer. This facilitates the handling of the barrier layer (improvement in the handling).

Preferably, in the present invention, the barrier layer has a layered structure, in which the organic layer is formed as the innermost layer facing the quantum dot layer. This allows the quantum dot layer to be easily formed on the barrier layer, and the adhesion between the barrier layer and the quantum dot layer can be improved.

Preferably, in the present invention, in the barrier layer, an inorganic layer is provided outside the innermost layer. This can effectively improve the barrier properties of the barrier layer.

Preferably, in the present invention, a plurality of the organic layers are provided, and an inorganic layer is sandwiched between the organic layers. With such a structure including three or more layers in which the innermost layer and the outermost layer in the barrier layer are organic layers and an inorganic layer is sandwiched between the organic layers, the handling, the barrier properties, the adhesion between the barrier layer and the quantum dot layer, etc. can effectively be improved. In the present invention, the inorganic layer is preferably formed from a SiO$_2$ layer.

Further, in the present invention, the organic layer is preferably formed in contact with the quantum dot layer.

Further, in the present invention, the organic layer is preferably formed from a PET film.

Further, in the present invention, the quantum dot layer preferably contains a thickening agent. For example, since the viscosity would likely be reduced when a dispersant is added to improve the dispersibility of quantum dots, a thickening agent is added to adjust the viscosity. This allows the quantum dot layer to be formed with a certain uniform thickness, thereby achieving good fluorescence properties.

Further, in the present invention, the quantum dot layer may contain a light-scattering agent. Further, a surface of the barrier layer may be matted. Thus, adding a light-scattering agent to the quantum dot layer or matting a surface of the barrier layer can promote light scattering.

In a method of producing a wavelength converting member according to the present invention, the barrier layer made of a material having a moisture vapor transmission rate of less than 9 g/(m$^2$·d) is formed on at least both sides of a quantum dot layer having quantum dots. In the present invention, the barrier layer made of a material having a moisture vapor transmission rate of less than 9 g/(m$^2$·d) is prepared, and the barrier layer is formed on at least both sides of the quantum dot layer. This makes it possible to produce a wavelength converting member which allows for easier production process and allows change in the light emission intensity to be effectively inhibited as compared with conventional techniques.

Further, in the method of producing a wavelength converting member of the present invention, the entire periphery of the quantum dot layer having quantum dots is covered by the barrier layer. This makes it possible to produce a wavelength converting member which allows change in the light emission intensity to be more effectively inhibited as compared with conventional techniques.

Further, in the present invention, the method preferably includes the steps of; forming a plurality of the quantum dot layers at intervals on a lower barrier layer; forming an upper barrier layer over a surface of the lower barrier layer and surfaces of the plurality of the quantum dot layers; and isolating the quantum dot layers by cutting the lower barrier layer and the upper barrier layer between the quantum dot layers. Thus, a plurality of wavelength converting members can be obtained at the same time.

Further, in the present invention, the quantum dot layer is preferably formed from a molding or formed by inkjet printing.

Preferably, in the present invention, the barrier layer has an organic layer, and the organic layer is provided on the innermost side to face the quantum dot layer. Thus, while the adhesion between the barrier layer and the quantum dot layer can be improved, high wettability of a surface of the organic layer can be achieved, and the quantum dot layer can be formed more easily.

Preferably, in the present invention, the barrier layer has a plurality of organic layers and an inorganic layer sandwiched between the organic layers, and the innermost layer of the barrier layer facing the quantum dot layer and the outermost layer thereof are constituted by the organic layers. The organic layers on both sides of the barrier layer allows for good handling, making it easier to form the quantum dot layer. Further, the inclusion of inorganic layer allows the barrier properties of the barrier layer to be effectively improved.

Further, in the present invention, the quantum dot layer preferably contains a thickening agent. This allows the viscosity of the quantum dot layer to be adjusted, which facilitates the formation of the quantum dot layer having a given thickness on the surface of the barrier layer.

Advantageous Effects of Invention

Thus, in accordance with the wavelength converting member of the present invention, change in the light emission intensity over time can effectively be inhibited as compared with conventional techniques.

DESCRIPTION OF EMBODIMENTS

Embodiments of the present invention (hereinafter simply referred to as "(disclosed) embodiments") will now be described in detail. The present invention is not limited to the following embodiments and can be variously altered without departing from the spirit of the present invention.

Figure 1A:
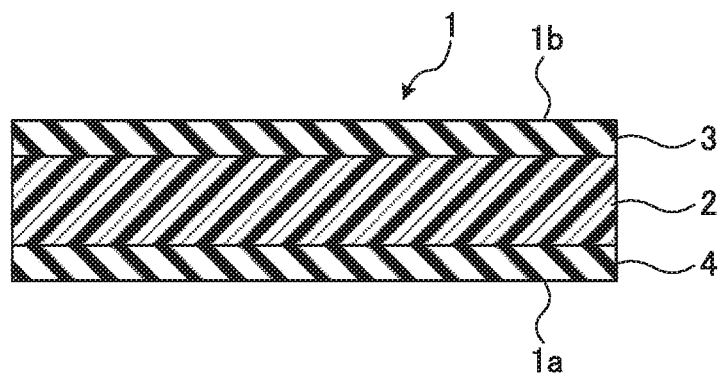
FIGS. 1A to 1C are longitudinal sectional views each showing a wavelength converting member exemplifying a first embodiment of the present invention.
Figure 1B:
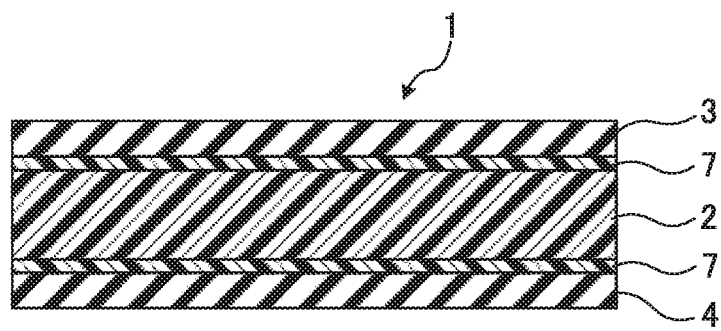
Figure 1C:
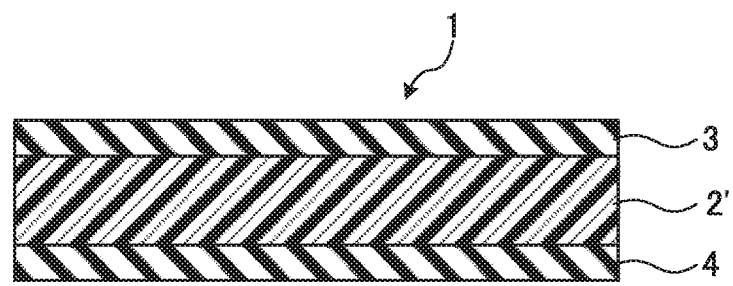
Figure 14:
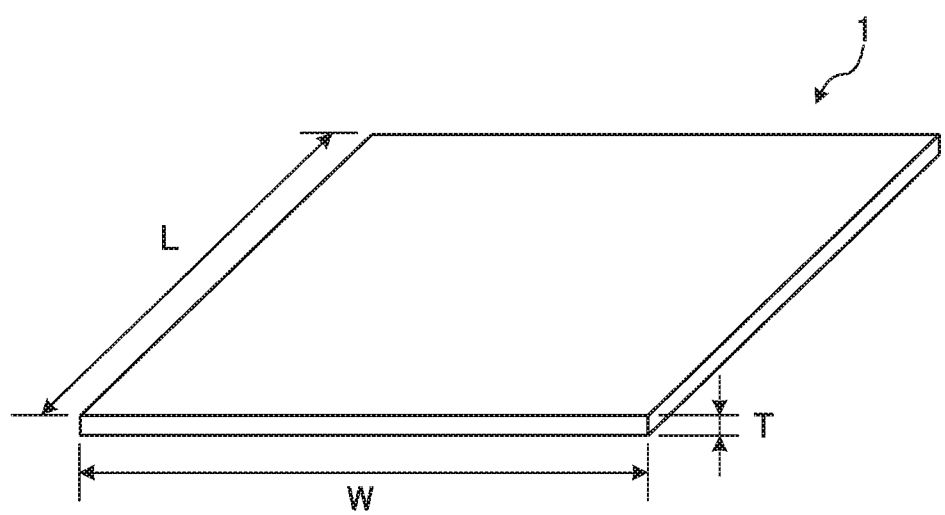
FIG. 14 is a perspective view of a wavelength converting member of the embodiments.

FIGS. 1A to 1C are longitudinal sectional views of a wavelength converting member exemplifying a first embodiment of the present invention. As shown in FIG. 1A, a wavelength converting member 1 includes a quantum dot layer 2 having quantum dots, barrier layers 3 and 4 formed on both sides of the quantum dot layer 2. As shown in FIG. 14, the wavelength converting member 1 is for example a sheet member shaped like a thin plate. In general, a "sheet" is defined as a structure having a thickness that is small relative to the length and the width. The wavelength converting member 1 may or may not be flexible, but is preferably flexible. The wavelength converting member 1 is sometimes simply called a sheet, or may be called a film or a film sheet. However, a "film" herein is defined as a flexible sheet product. Further, the wavelength converting member 1 may be formed with a uniform thickness, or may have a structure in which the thickness varies from point to point in the member, varies gradually in the length direction or the width direction, or varies in stages. The length dimension L, the width dimension W, and the thickness dimension T of the wavelength converting member 1 are not limited, and may be varied depending on the product. For example, the wavelength converting member can be used for a back light of a large product such as a TV set, or can be used for a back light of a small portable device such as a smartphone. Accordingly, the size of the wavelength converting member is determined in accordance with the size of the product.

The quantum dot layer 2 includes numerous quantum dots, and may also include a fluorescent pigment, a fluorescent dye, or the like in addition to the quantum dots.

The quantum dot layer 2 is preferably formed from a resin composition in which quantum dots are dispersed. Examples of resins (binders) that can be used include: polypropylene, polyethylene, polystyrene, AS resin, ABS resin, acrylic resin, methacrylate resin, polyvinyl chloride, polyacetal, polyamide, polycarbonate, modified polyphenylene ether, polybutylene terephthalate, polyethylene terephthalate, polysulfone, polyethersulfone, polyphenylene sulfide, polyamide-imide, polymethylpentene, liquid crystal polymers, epoxy resin, phenol resin, urea formaldehyde resin, melamine resin, diallyl phthalate resin, unsaturated polyester resin, polyimide, polyurethane, silicone resin, a styrene-based thermoplastic elastomer, and mixtures thereof. For example, a urethane-acrylic resin, urethane acrylate, a styrene-based thermoplastic elastomer, etc. can be used preferably. HYBRAR® available from KURARAY CO., LTD. can be given as an example of a styrene-based thermoplastic elastomer.

Although the structure and the material of the quantum dots are not limited; for example, a quantum dot in this embodiment can have a semiconductor core having a diameter of two nanometers to several tens of nanometers. Further, a quantum dot can have, in addition to the core consisting of a semiconductor particle, a shell part covering the circumference of the core. The diameter of the core consisting of a semiconductor particle may be 2 nm to 20 nm, preferably, 2 nm to 15 nm. This does not limit the material of the core. For example, the core can use a core material containing at least Zn and Cd; a core material containing Zn, Cd, Se, and S; ZnCuInS; CdS; ZnSe; ZnS; CdSe; InP; CdTe; or a composite thereof.

The quantum dots include, for example, quantum dots having a fluorescence wavelength of approximately 520 nm (green) and those having a fluorescence wavelength of approximately 660 nm (red). Accordingly, when blue light enters the light entrance plane 1a as shown in FIGS. 1A to 1C, the quantum dots convert part of the blue light into green or red light. Thus, white light can be obtained from the light exit plane 1b.

For example, the quantum dot layer 2 is formed by coating the surface of a film like barrier layer with a resin composition in which quantum dots are dispersed, or by previously shaping the resin composition into a predetermined shape.

As shown in FIG. 1A, the barrier layers 3 and 4 are individually placed on both sides of the quantum dot layer 2. As shown in FIG. 1B, the barrier layers 3 and 4 can be joined to both surfaces of the quantum dot layer 2 with adhesive layers 7 provided therebetween. Thus provided barrier layers 3 and 4 protect both surfaces of the quantum dot layer 2, leading to improved resistance to environment (durability). Such a structure in which barrier layers are placed on both sides of a quantum dot layer has conventionally been studied (PTL 1). However, the structure does not limit the structure of the barrier layers in terms of inhibiting change in the light emission intensity of the wavelength converting member over time.

This being the case, in this embodiment, the moisture vapor transmission rate of the barrier layers 3 and 4 is set to lower than 9 g/(m²·d), Here, the "moisture vapor transmission rate" can be Measured based on JIS K7129 (:2008). Specifically, the moisture vapor transmission rate can be measured using, without limitation, a humidity sensor method, an infrared sensor method, or a gas chromatography method. In this embodiment, the moisture vapor transmission rate of the barrier layers 3 and 4 is preferably 5 g/(m²·d) or less, more preferably 3 g/(m²·d) or less, still more preferably 1 g/(m²·d) or less, yet more preferably 0.1 g/(m²·d) or less, and even more preferably 0.01 g/(m²·d) or less. The moisture vapor transmission rate is most preferably $6 \times 10^{-3}$ g/(m²·d) or less.

Thus, change in the light emission intensity over time can be effectively inhibited as compared with conventional techniques by controlling the moisture vapor transmission rate of the barrier layers 3 and 4. For example, as shown in the experimental results described below, when quantum dots having a green fluorescence wavelength were used, for a sample in which barrier layers having a moisture vapor transmission rate of 9 g/(m²·d) were used, the light emission intensity of the blue fluorescence wavelength (incident light) gradually increased over time while the light emission intensity of the green fluorescence wavelength decreased rapidly. For endurance test conditions, the temperature was set at 60° C., and the humidity was set at 90%.

The high moisture vapor transmission rate of the barrier layers 3 and 4 increases the amount of water vapor reaching the quantum dot layer 2, so that the quantum dots contained in the quantum dot layer 2 are likely to deteriorate. To address this problem, in this embodiment, the moisture vapor transmission rate of the barrier layers 3 and 4 is set to lower than 9 g/(m²·d) so as to protect the quantum dots from the adverse environment or rapid changes in the environment. Thus, deterioration of the quantum dots can be suppressed and change in the light intensity over time can be effectively inhibited. The experiments described below proved that change in the light emission intensity over time could effectively be inhibited when the moisture vapor transmission rate of the barrier layers 3 and 4 was 0.1 g/(m²·d) or less.

In FIG. 1B, the quantum dot layer 2 is joined to the barrier layers 3 and 4 with the adhesive layers 7 therebetween; alternatively, as shown in FIG. 1C, the barrier layers 3 and 4 can be directly jointed to both sides of a quantum dot layer 2' without providing the adhesive layers 7.

In the structure of FIG. 1C, for example, when an adhesive component is contained in the quantum dot layer 2', the barrier layers 3 and 4 can be joined to both surfaces of the quantum dot layer 2'. This makes it possible to reduce the sheet thickness of the wavelength converting member 1; for example, the thickness can be adjusted to 100 μm or less.

Even for the structure in which the adhesive layers 7 are provided as shown in FIG. 1B, for example, when the quantum dot layer 2 is formed by calendaring a substrate for supporting the quantum dot layer 2 is not required; in addition, the quantum dot layer 2 can be formed with a thin sheet thickness, specifically of approximately 70 μm or less, which allows the wavelength converting member 1 to be formed with a thin sheet thickness.

Next, in addition to the fact that the moisture vapor transmission rate of the barrier layers 3 and 4 is less than 9 g/(m²·d), the material and structure of the barrier layers 3 and 4 that are preferred in this embodiment will be described. Note that the following embodiment does not limit the presence or absence of the adhesive layers or the state of the quantum dot layer to those in FIG. 1B and FIG. 1C.

Figure 2:
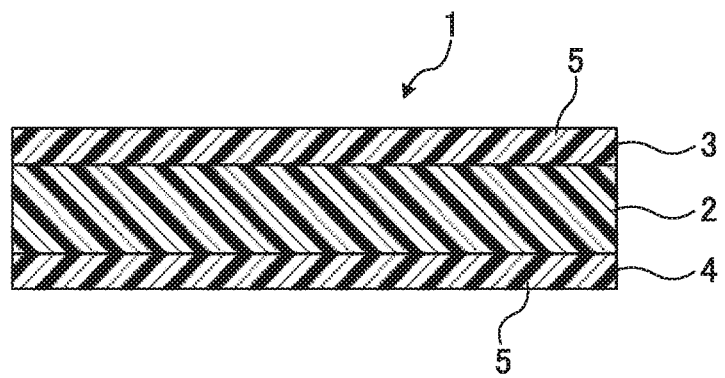
FIG. 2 is a longitudinal sectional view of a wavelength converting member exemplifying a second embodiment of the present invention.

In FIG. 2, the barrier layers 3 and 4 are each formed as a single layer of an organic layer S. The organic layer 5 constitutes a resin film, and the barrier layers 3 and 4 are present as resin films, which results in easier handling of the barrier layers 3 and 4. Further, in FIG. 2, the organic layer 5 abuts the quantum dot layer 2. Here, since the surface of the organic layer 5 is excellent in wettability, when the quantum dot layer 2 is formed by application, the quantum dot layer 2 can easily be formed with a given thickness on the surfaces of the barrier layers 3 and 4. Further, the adhesion between the quantum dot layer 2 and the organic layer 5 can be improved by thermocompression bonding, etc. In this embodiment, the organic layer 5 is preferably a PET (polyethylene terephthalate) film. This allows for high light transmittance, and can effectively improve the above-described handling and the adhesion between the organic layer and the quantum dot layer 2.

Figure 3:
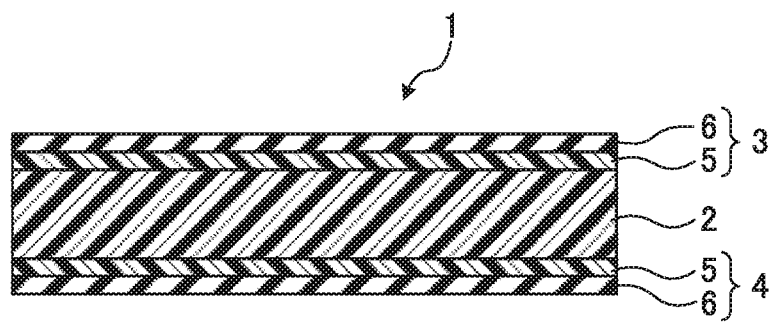
FIG. 3 is a longitudinal sectional view of a wavelength converting member exemplifying a third embodiment of the present invention.

Further, in FIG. 3, the barrier layers 3 and 4 are each formed to have a layered structure composed of the organic layer 5 and an inorganic layer 6. In this case, the organic layers 5 are formed as the innermost layers in the barrier layers 3 and 4 that are in contact with the quantum dot layer 2, and the inorganic layers 6 are formed on the outer sides of the innermost layers (as the outermost layers). The organic layers S are preferably PET (polyethylene terephthalate) films. The inorganic layers 6 are preferably $SiO_2$ layers. Further, the inorganic layer 6 may be a layer of silicon nitride ($SiN_x$), aluminum oxide ($Al_2O_3$), titanium oxide ($TiO_2$), or silicon oxide ($SiO_2$), or a laminate thereof. The provision of such organic layers 5 facilitates the handling of the barrier layers 3 and 4. Further, since the organic layers 5 are placed inside in the barrier layers 3 and 4, the organic layers 5 can abut the quantum dot layer 2. Accordingly, as with FIG. 2, when the quantum dot layer 2 is formed by application, the formation can be facilitated, and the adhesion between the quantum dot layer 2 and the organic layers 5 can be improved. Further, in FIG. 3, the inorganic layers 6 are provided in the barrier layers 3 and 4, resulting in excellent barrier properties even when the barrier layers 3 and 4 are thin. The barrier properties here refer to water vapor transmission properties and gas barrier properties. In this embodiment, the moisture vapor transmission rate of the barrier layers 3 and 4 can be made lower than 9 g/(m²·d) even when the thickness of the barrier layers 3 and 4 is as small as several tens of micrometers. The gas barrier properties may be evaluated with oxygen transmission rate. In FIG. 3, the barrier layers 3 and 4 each have a two-layer structure having a single layer of the organic layer 5 and a single layer of the inorganic layer 6; alternatively, they may each have a structure in which a plurality of the organic layers 5 and a plurality of the inorganic layers 6 alternately stacked (provided that the innermost layers of the barrier layers 3 and 4 are preferably the organic layers 5).

Figure 4A:
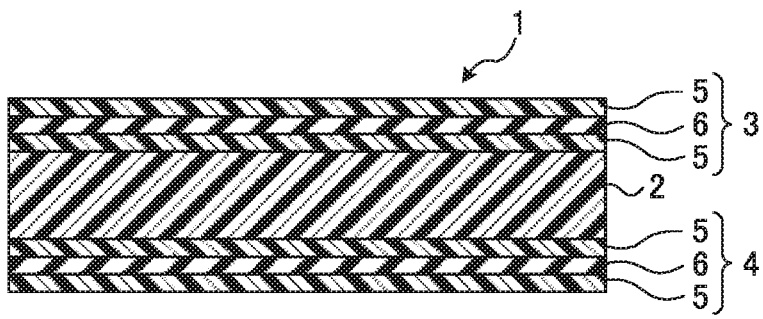
FIGS. 4A and 4B are longitudinal sectional views each showing a wavelength converting member exemplifying a fourth embodiment of the present invention.

In FIG. 4A, the barrier layers 3 and 4 are each formed with a layered structure composed of a plurality of the organic layers 5 and the inorganic layer 6 sandwiched between the organic layers 5. The organic layers 5 are preferably PET (polyethylene terephthalate) films. Further, the organic layers 5 preferably contain a diffusion agent. Alternatively, a diffusion promoting layer can be formed between the quantum dot layer 2 and the organic layers 5. The inorganic layer 6 is preferably a $SiO_2$ layer. Further, the inorganic layer 6 may be a layer of silicon nitride ($SiN_x$), aluminum oxide ($Al_2O_3$), titanium oxide ($TiO_2$), or silicon oxide ($SiO_2$), or a laminate thereof. In FIG. 4A, the barrier layers 3 and 4 each have a three-layer structure composed of two organic layers 5 and one inorganic layer 6; alternatively, they may each have a structure composed of five or more layers.

In FIG. 4A, both the benefits from the barrier structure shown in FIG. 2 and the benefits from the barrier structure shown in FIG. 3 can be achieved. Specifically, as shown in FIG. 4A, the innermost layers and the outermost layers in the barrier layers 3 and 4 are formed from the organic layers 5. Accordingly, the handling of the barrier layers 3 and 4 can be more effectively facilitated. In addition, this makes it possible to effectively achieve higher adhesion between the barrier layers 3 and 4 and the quantum dot layer 2, easier formation of the quantum dot layer 2, and higher barrier properties of the barrier layers 3 and 4.

Note that as an alternative to the structure in FIG. 4A, for example, the barrier layers 3 and 4 may each have a layered structure of inorganic layer 6-organic layer 5-inorganic layer 6. In this geometry, a plurality of the inorganic layers 6 are placed in each of the barrier layers 3 and 4, which allows the barrier layers 3 and 4 to have more excellent barrier properties.

In the above structure, the barrier layers 3 and 4 are each placed on either side of the quantum dot layer 2. Specifically, the barrier layers 3 and 4 can each have a different layered structure such as the single layer structure shown in FIG. 2 or the layered structures shown in FIG. 3 and FIG. 4A; and the barrier properties, typified by the moisture vapor transmission rate, of the barrier layers 3 and 4 may have the nominal values, for example.

Figure 4B:
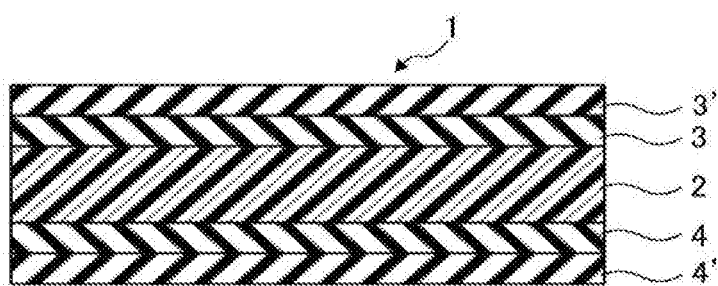

On the other hand, in FIG. 4B, a plurality of barrier layers 3, 4, 3', and 4' are stacked on both sides of the quantum dot layer 2. For example, the barrier layers 3, 4, 3', and 4' are each formed with a single layer structure or a layered structure shown in FIG. 2, FIG. 3, and FIG. 4A. The barrier layer 3 is joined to the barrier layer 3' and the barrier layer 4 is joined to the barrier layer 4' using an adhesive or the like. For example, the barrier layers 3, 4, 3', and 4' each have a layered structure of organic layer (for example, a PET film) inorganic layer (for example, $SiO_2$). In the laminate, the inorganic layers are provided inside to be closer to the quantum dot layer 2, whereas the organic layers are provided on the outer sides. Specifically, in FIG. 4B, for example, the laminate has barrier layer 4' (organic layer-inorganic layer), barrier layer 4 (organic layer-inorganic layer), quantum dot layer 2, barrier layer 3 (inorganic layer-organic layer) and barrier layer 3' (inorganic layer-organic layer), stacked in this order from the lower side to the upper side in the diagram.

When the plurality of the barrier layers 3, 4, 3', and 4' are stacked as described above, variations can be reduced and the barrier properties can be steadily improved even when the barrier layers 3, 4, 3', and 4' used have low barrier properties.

Further, in the above structures, the barrier layers placed on both sides of the quantum dot layer 2 have symmetric layered structures; alternatively, the barrier layers may have asymmetric structures.

In addition, the following processes may be performed to improve the light scattering capability of the wavelength converting member 1. Specifically, in the embodiment shown in FIG. 5, surfaces of the barrier layers 3 and 4 are matted. For example, the barrier layers 3 and 4 can be each formed as a laminate of inorganic layer-organic layer-matted layer. In such a structure, surfaces 3a and 4a of the respective barrier layers 3 and 4 have irregularities. Alternatively, a surface of one of the barrier layer 3 and the barrier layer 4 may be matted. Yet alternatively, a light-scattering agent 8 may be contained in the quantum dot layer 2 as shown in FIG. 6. Examples of the material of the light-scattering agent 8 can include, but not limited to, fine particles of BN, AlN, or the like. By way of example, the light-scattering agent 8 may be contained at 1 wt % to 10 wt % with respect to the quantum dot layer 2. Further, the light-scattering agent 8 may be contained in the barrier layers 3 and 4. In this case, the concentration of the light-scattering agent 8 contained in the quantum dot layer 2 may be equal to or different from the concentration of the light-scattering agent contained in the barrier layers 3 and 4. The barrier layers 3 and 4 shown in FIG. 5 and FIG. 6 may have any one of the structures in FIG. 2 to FIG. 4B. For example, a surface of one of the barrier layer 3 and the barrier layer 4 may be matted; the quantum dot layer 2 may contain the light-scattering agent 8; and the barrier layer 3 or the barrier layer 4 may contain the light-scattering agent 8.

Figure 7:
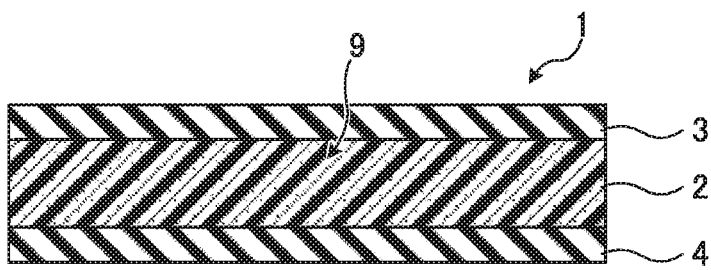
FIG. 7 is a longitudinal sectional view of a wavelength converting member exemplifying a seventh embodiment of the present invention.

In another embodiment shown in FIG. 7, the quantum dot layer 2 contains a thickening agent 9. Examples of the thickening agent 9 can include, but not limited to, carboxyvinyl polymers-based, carboxymethyl cellulose-based, methyl ether acrylate copolymers-based; and bentonite (aluminum silicate)-based or hectorite (magnesium silicate)-based additives. When the thickening agent 9 is contained, the viscosity of the resin composition forming the quantum dot layer 2 can be appropriately adjusted, and the quantum dot layer 2 can easily be formed with a given thickness and a given shape.

Figure 5:
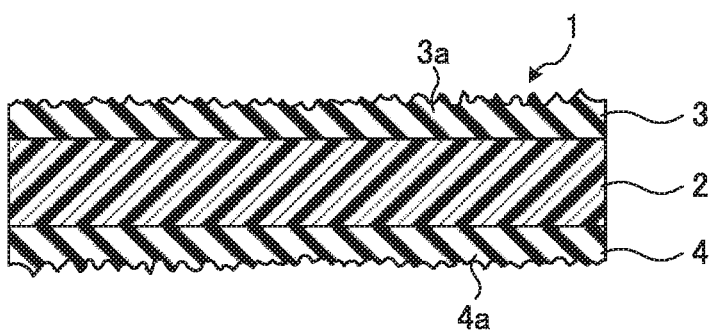
FIG. 5 is a longitudinal sectional view of a wavelength converting member exemplifying a fifth embodiment of the present invention.
Figure 6:
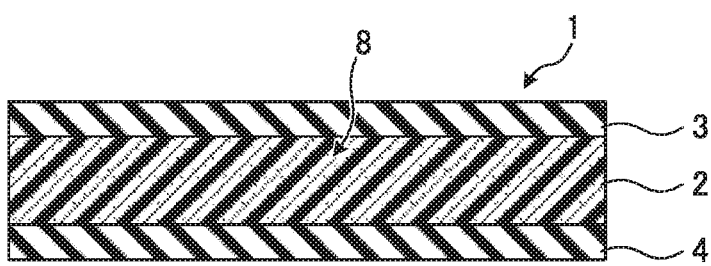
FIG. 6 is a longitudinal sectional view of a wavelength converting member exemplifying a sixth embodiment of the present invention.

In FIG. 6 and FIG. 7, the barrier layers 3 and 4 may be matted as in FIG. 5.

Further, in this embodiment, the quantum dot layer 2 preferably contains a dispersant to improve the dispersibility of the quantum dots contained in the quantum dot layer 2. Examples of the material of the dispersant used include, but not limited to, additives of epoxy resins, polyurethanes, polycarboxylates, acid-formaldehyde condensate polymers of naphthalenesulfonic, polyethylene glycols, compounds of partial alkyl ester of a polycarboxylic acid, polyethers, polyalkylene polyamines, alkyl sulfonate salts, quaternary ammonium salts, higher alcohol alkylene oxides, polyhydric alcohol esters, alkyl polyamines, or polyphosphates. DISPERBYK® available from BYK Japan KK can be given as a specific example.

As shown in Table 1 below, when quantum dots were mixed and dispersed in a liquid resin, the viscosity was found to decrease. When the viscosity was measured, the shear rate was 15/s to 500/s. The unit of the viscosity shown in the table is (mPa·s).

TABLE 1

| Resin only (without quantum dots) | Quantum dots mixed in Resin |
|---|---|
| 6603 | 3170 |
| 8906 | 3367 |

Accordingly, in order to keep the viscosity within a predetermined range for facilitating the formation of the quantum dot layer 2, the viscosity is preferably adjusted for example by adding the above thickening agent. Note that the values of the viscosity shown in Table 1 are mere examples, and the viscosity can be adjusted to a required level as appropriate.

Figure 8:
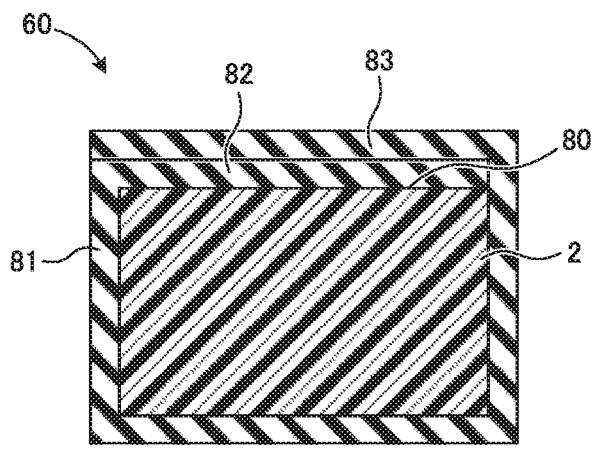
FIG. 8 is a longitudinal sectional view of a wavelength converting member exemplifying an eighth embodiment of the present invention.

In the embodiments shown in FIG. 1A to FIG. 7, the barrier layers are placed at least on both the top and bottom of the quantum dot layer 2, and no limitation is placed on the provision of the barrier layers at edges on the sides of the quantum dot layer 2 (the right and left sides of the quantum dot layer 2 in the diagram). On the other hand, in structures described below, a barrier layer is formed around the entire periphery of the quantum dot layer 2. FIG. 8 is a longitudinal sectional view of a wavelength converting member exemplifying an eighth embodiment of the present invention. The entire periphery of the quantum dot layer 2 is covered with the barrier layer 81, which allows the entire periphery of the quantum dot layer 2 to be protected. Accordingly, the durability can be improved as compared with the case where only both the top and bottom of the quantum dot layer 2 are protected as shown in FIGS. 1A to 1C. Thus, deterioration of the quantum dot layer 2 can suitably be suppressed. As shown in FIG. 8, a wrap starting end 82 and a wrap finishing end 83 of the barrier layer 81 overlap on a top surface 80 of the quantum dot layer 2. It will be appreciated that the position where the wrap starting end 82 and the wrap finishing end 83 overlap may be on any one of the top surface 80, the bottom surface, the right side, and the left side of the quantum dot layer 2. For the region where the wrap starting end 82 and the wrap finishing end 83 overlap, the wrap starting end 82 and the wrap finishing end 83 are joined for example by thermocompression bonding and bonding. In the structure shown in FIG. 8, the wrap starting end 82 and the wrap finishing end 83 overlap in a position facing one face of the quantum dot layer 2, so that the barrier layer 81 can be used without waste.

Figure 9:
FIG. 9 is a longitudinal sectional view of a wavelength converting member exemplifying a ninth embodiment of the present invention.

Without limiting the overall shape of a wavelength converting member 60 shown in FIG. 8, the wavelength converting member 60 may be shaped like a stick, a block, or a chip, or may be shaped like a sheet obtained by extending the length dimension of the quantum dot layer 2 in the lateral direction in the diagram shown in FIG. 8, FIG. 9 is a longitudinal sectional view of a wavelength converting member exemplifying a ninth embodiment of the present invention. In FIG. 9, the barrier layer 81 covers the entire periphery of the quantum dot layer 2, and the wrap starting end 82 and the wrap finishing end 83 of the barrier layer 81 are joined for example by thermocompression bonding at an edge on one side of the quantum dot layer 2 (the right side of the quantum dot layer 2 in the diagram). Thus, the structure in which the wrap starting end 82 and the wrap finishing end 83 of the barrier layer 81 are joined at an edge on one side of the quantum dot layer 2 allows the wrap starting end 82 and the wrap finishing end 83 to be joined in a region without affecting the quantum dot layer 2. For example, when the wrap starting end 82 and the wrap finishing end 83 are joined by thermocompression bonding, the quantum dot layer 2 can be prevented from being heated, and thermal effects on the quantum dot layer 2 can be suppressed. Alternatively, the wrap starting end 82 and the wrap finishing end 83 may be joined by bonding.

Figure 10:
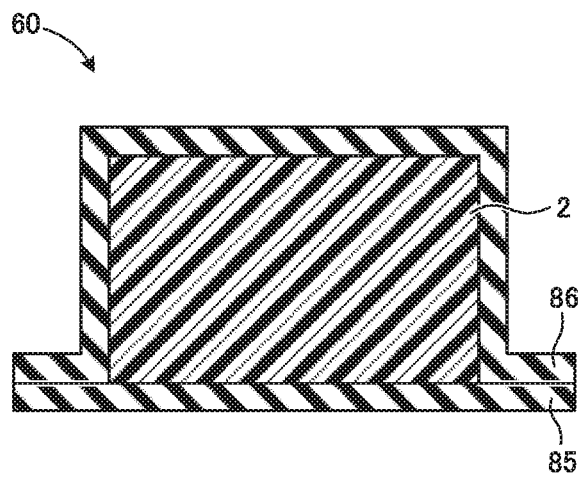
FIG. 10 is a longitudinal sectional view of a wavelength converting member exemplifying a tenth embodiment of the present invention.

FIG. 10 is a longitudinal sectional view of a wavelength converting member exemplifying a tenth embodiment of the present invention. In FIG. 10, the quantum dot layer 2 is provided on a lower barrier layer 85, and an upper barrier layer 86 is provided to cover the lower barrier layer 85 and the quantum dot layer 2. The barrier layers 85 and 86 placed on both the top and bottom of the quantum dot layer 2 are joined to each other at edges on the sides of the quantum dot layer 2 (the right and left sides of the quantum dot layer 2 in the diagram) for example by bonding or thermocompression bonding. Since the barrier layers 85 and 86 are joined to each other at the edges of the quantum dot layer 2, effects of the joining process on the quantum dot layer 2 can be suppressed. Further, in the structure of FIG. 10, unlike in FIG. 8 and FIG. 9, the barrier layers 85 and 86 are two separate layers, and the quantum dot layer 2 is sandwiched between the barrier layers 85 and 86. Accordingly, it is not necessary to wrap the entire periphery of the quantum dot layer 2 with the barrier layer 81 as in the structures shown in FIG. 8 and FIG. 9. Therefore, the wavelength converting member 60 can easily be formed with the barrier layers being formed on the entire periphery of the quantum dot layer 2, and the structure shown in FIG. 10 is suitable for mass production of the wavelength converting member 60.

In FIG. 1A to FIG. 10, for example, the quantum dot layer 2 is formed from a molding. Specifically, the quantum dot layer 2 is formed for example by injection molding, and the barrier layer(s) are provided on the molding of the quantum dot layer 2. When the quantum dot layer 2 is formed from a molding, wavelength converting members having various shapes can be easily and suitably formed. In this embodiment, the quantum dot layer 2 is not necessarily formed from a molding, and may be formed by application. In the case of application, a barrier layer is previously prepared, and the quantum dot layer 2 is applied to the barrier layer. The application can be performed for example by inkjet printing or a dispenser method. In particular, inkjet printing is preferred.

Figure 11:
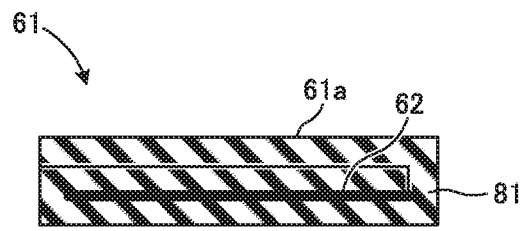
FIG. 11 is a longitudinal sectional view of a wavelength converting member exemplifying an eleventh embodiment of the present invention.
Figure 12:
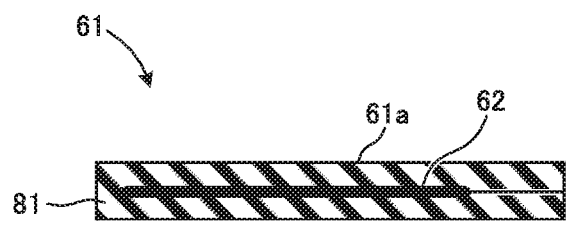
FIG. 12 is a longitudinal sectional view of a wavelength converting member exemplifying a twelfth embodiment of the present invention.
Figure 13:
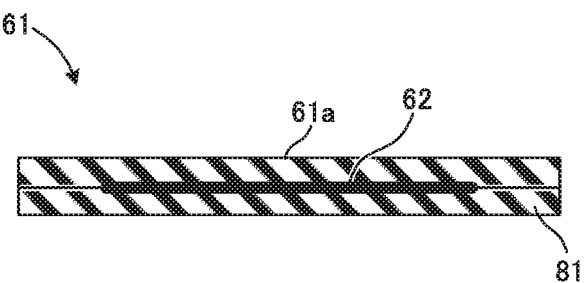
FIG. 13 is a longitudinal sectional view of a wavelength converting member exemplifying a thirteenth embodiment of the present invention.

In FIG. 11 to FIG. 13, a quantum dot layer 62 is formed by inkjet printing, in a wavelength converting member 61 shown in FIG. 11, the quantum dot layer 62 is formed by inkjet printing, and the structure of the barrier layer 81 provided on the quantum dot layer 62 is the same as that in FIG. 8. Further, in the wavelength converting member 61 shown in FIG. 12, the quantum dot layer 62 is formed by inkjet printing, and the structure of the barrier layer 81 provided on the quantum dot layer 62 is the same as that in FIG. 9. Further, in the wavelength converting member 61 shown in FIG. 13, the quantum dot layer 62 is formed by inkjet printing, and the structure of the barrier layers 81 provided on the quantum dot layer 62 is the same as that in FIG. 10.

When the quantum dot layer 62 is formed by inkjet printing, the quantum dot layer 62 can be formed with a significantly thin thickness. As a result, as shown in FIG. 11 to FIG. 13, a surface 61a of the wavelength converting member 61 can be planarized.

Figure 15:
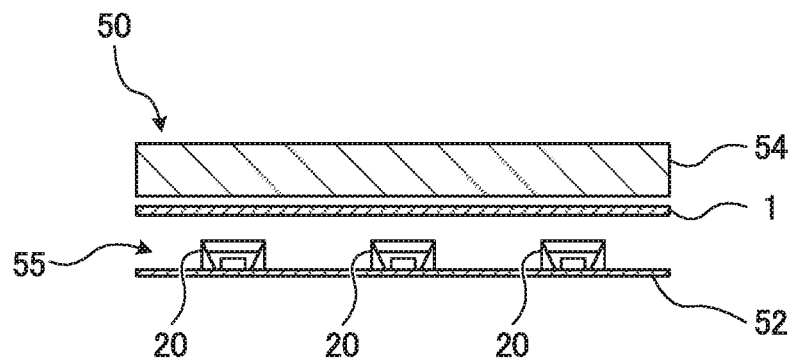
FIG. 15 is a longitudinal sectional view of a display device using a wavelength converting member of the embodiments.
Figure 16:
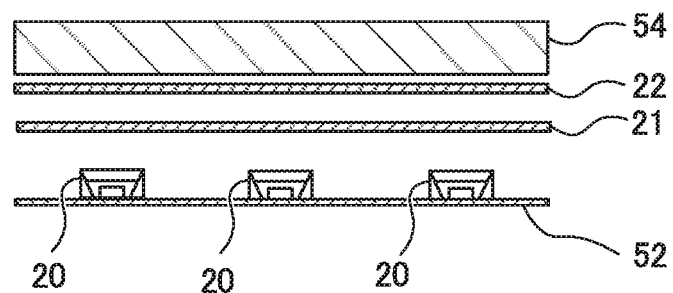
FIG. 16 is a longitudinal sectional view of a display device using a wavelength converting member of the embodiments, different from FIG. 15.
Figure 17:
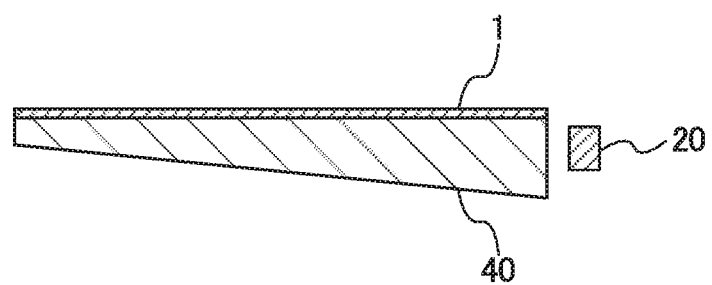
FIG. 17 is a longitudinal sectional view of a light guide member using a wavelength converting member of the embodiments.

For example, the wavelength converting members 1, 60, and 61 of the disclosed embodiments can each be incorporated into a back light unit 55 shown in FIG. 15. In FIG. 15 to FIG. 17, the wavelength converting member 1 is illustrated as an example. In FIG. 15, the back light unit 55 is configured to have a plurality of light emitting devices 20 (LEDs) and the wavelength converting member 1 of this embodiment that faces the light emitting devices 20. As shown in FIG. 15, the light emitting devices 20 are supported on a surface of a support 52. In FIG. 15, the back light unit 55 is placed on the back side of a display area 54 of, for example, a liquid crystal display, and constitutes part of a display device 50.

Although not shown in FIG. 15, in addition to the wavelength converting member 1, a diffuser panel for diffusing light, and other sheets may be provided between the light emitting devices 20 and the display area 54.

When the wavelength converting member 1 is formed like a sheet as shown in FIG. 14, the wavelength converting member 1 in the form of a single sheet may be placed between the light emitting devices 20 and the display area 54 as shown in FIG. 15. Alternatively, for example, a plurality of the wavelength converting members 1 may be joined together to achieve a predetermined size. A structure in which the plurality of wavelength converting members 1 are joined together by tiling is hereinafter referred to as a compound wavelength converting member.

Here, a structure in which the compound wavelength converting member is placed instead of the wavelength converting member 1 of the display device 50 in FIG. 15, and a diffuser panel is placed between the light emitting devices 20 and the compound wavelength converting member, that is, a structure of light emitting devices 20-diffuser panel-compound wavelength converting member-display area 54 will be discussed. With such a structure, light emitted from the light emitting devices 20 and diffused by the diffuser panel enters the compound wavelength converting member. Since the light diffused by the diffuser panel enters the compound wavelength converting member, the distribution of the light intensity depending on the distance from the light emitting devices 20 can be reduced. The distance between the light emitting devices 20 and the compound wavelength converting member is longer than in the case where the diffuser panel is not provided, which reduces effects of heat radiated from the light emitting devices 20 on the quantum dots contained in the compound sheet.

On the other hand, as shown in FIG. 16, the structure may have light emitting devices 20-compound wavelength converting member 21-diffuser panel 22-display area 54 placed in this order. Accordingly, even when irregular reflection occurs at the joints between the wavelength converting members 1 or the emission color varies due to deterioration of quantum dots caused by water vapor having entered through the joints, color unevenness in the display of the display area 54 can be suitably reduced. Specifically, since the light output from the compound wavelength converting member 21 is diffused by the diffuser panel 22 and then enters the display area 54, color unevenness in the display of the display area 54 can be reduced.

When the compound wavelength converting member 21 is used, a diffuser panel is preferably placed on the light emission side of the compound wavelength converting member 21 not only when the compound wavelength converting member 21 is used for the display device shown in FIG. 16, but also when the compound wavelength converting member 21 is used for example for a lighting.

Alternatively, as shown in FIG. 17, the wavelength converting member 1 of this embodiment may be provided at least either on a surface of a light guide plate 40 or between the light guide plate 40 and light emitting devices 20 to serve as a light guide member. As shown in FIG. 17, the light emitting devices 20 (LEDs) are placed to face the light guide plate 40. Note that the use of the wavelength converting member 1 of the embodiments is not limited to those shown in FIG. 15, FIG. 16, and FIG. 17.

In the disclosed embodiments, change in the light emission intensity of the wavelength converting member 1 over time can be effectively reduced as compared with conventional techniques. Accordingly, when the wavelength converting member 1 of the disclosed embodiments is used for the back light unit 55, the light guide member, etc., the wavelength conversion characteristics can be made stable and the lifespan of the back light unit 55 and the light guide member can be extended.

Further, the wavelength converting member i of this embodiment can be flexible. This allows the wavelength converting member 1 to be suitably placed for example on a curved surface.

Note that the wavelength converting member 1 of this embodiment can also be used for a lighting device, a light source unit, a light diffusion apparatus, a light reflector system, etc. other than the back light unit or the light guide member described above.

Further, in FIG. 15, FIG. 16, and FIG. 17, a wavelength converting member 61 in which one of the quantum dot layers 62 shown in FIG. 11 to FIG. 13 is formed by inkjet printing can be used. The wavelength converting members 1, 60, and 61 shown in FIG. 1 to FIG. 13 may each be placed inside a glass capillary.

Figure 18:
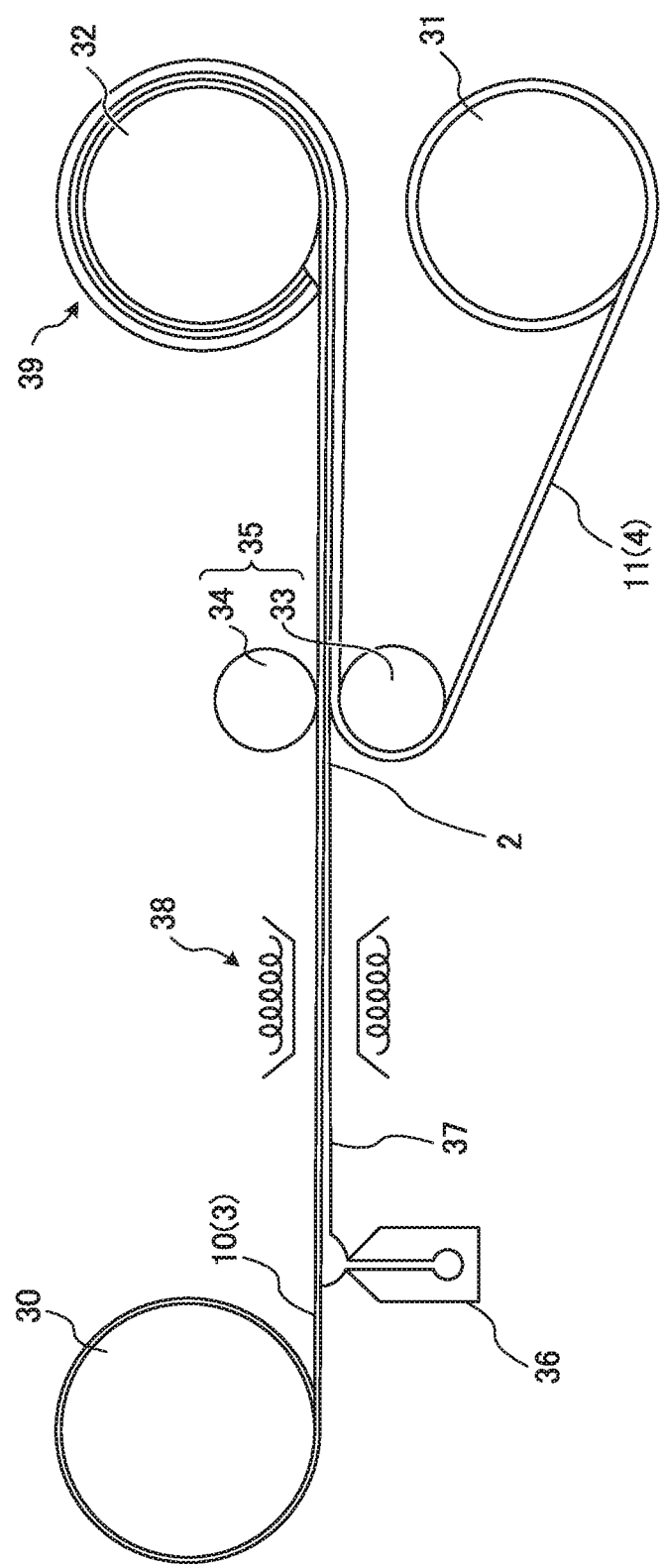
FIG. 18 is a conceptual diagram of an apparatus for producing a wavelength converting member of the embodiments.

FIG. 18 is a conceptual diagram for illustrating apparatus for producing a wavelength converting member of this embodiment. A shown in FIG. 18, the apparatus is configured to have a first web roll 30 for feeding a resin film 10 to be the barrier layer 3 and a second web roll 31 for feeding a resin film 11 to be a barrier layer 4, a take-up roll 32, and a pressure contact portion 35 composed of a pair of nip rolls 33 and 34, a coating means 36, and a heating unit 38.

As shown in FIG. 18, the resin film 10 having a moisture vapor transmission rate of less than 9 g/(m$^2$·d) is fed from the first web roll 30, and a surface of the resin film 10 is coated with a resin composition 37 containing quantum dots using the coating means 36. The resin composition 37 can be applied for example by an application method using a known application coater or an impregnation coater. Examples of the coater include a gravure coater, a dip coater, and a comma knife coater. Alternatively, the resin composition 37 can be applied by inkjet printing.

As shown in FIG. 18, the resin film 10 of which surface is coated with the resin composition 37 is heated by the heating unit 38 provided with heaters, etc. This leads to evaporation of a solvent contained in the resin composition 37, and the quantum dot layer 2 is solidified to a certain extent at this time.

Subsequently, as shown in FIG. 18, the resin film 11 having a moisture vapor transmission rate of less than 9 g/(m$^2$·d) fed from the second web roll 31 abuts an exposed surface of the quantum dot layer 2, and a layered structure of resin film 11-quantum dot layer 2-resin film 10 is pressured and welded between the nip rolls 33 and 34 composing the pressure contact portion 35. In the pressure contact portion 35, the boundaries of the quantum dot layer 2 and the resin films 10 and 11 are fixed by thermocompression bonding.

A sheet member 39 composed of resin film 11-quantum dot layer 2-resin film 10 is wound on the take-up roll 32. The wound sheet member 39 is cut into a predetermined size, thereby obtaining the wavelength converting member 1 shaped like a sheet.

In the above production method, the quantum dot layer 2 is formed by application on the resin film 10, and the thickness of the quantum dot layer 2 formed can be roughly from 10 μm to 500 μm. Further, the thickness of the resin films 10 and 11 is roughly from a few tens of micrometers to 1000 micrometers, so that the thickness of the wavelength converting member 1 is roughly from 50 μm to 2500 μm. Note that the thickness of the quantum dot layer 2 and the thickness of the wavelength converting member 1 are not limited.

The resin films 10 and 11 illustrated in FIG. 18 each have a single layer of the organic layer 5 shown in FIG. 2 or a layered structure having the organic layer 5 and the inorganic layer 6 shown in one of FIG. 3 and FIGS. 4A and 4B. Preferably, the inorganic layer 6 is provided between the plurality of organic layers 5 as shown in FIG. 4A. Specifically, the resin films 10 and 11 preferably each have a layered structure of PET film-$SiO_2$ layer-PET film.

Alternatively, a stack of a plurality of resin films can be fed to be placed on both surfaces of the quantum dot layer to provide a structure in which the a plurality of barrier layers are placed on both sides of the quantum dot layer as shown in FIG. 4B.

The matting process shown in FIG. 5 is performed on one or both of the surfaces of the sheet member 39 wound on the take-up roll 32 shown in FIG. 18 or is performed on both surfaces of the wavelength converting member 1 shown in FIG. 14, formed by cutting the sheet member 39 into a predetermined size.

The matting process cart be performed for example by sandblasting the sheet surface, or by coating the sheet surface with a mat layer, but is not limited thereto. Further, as shown in FIG. 6, in order to obtain the quantum dot layer 2 containing the light-scattering agent 8, the light-scattering agent 8 can be added to the resin composition 37 to be applied with the coating means 36 shown in FIG. 18. When the thickening agent 9 is contained in the resin composition 37 to be applied with the coating means 36 shown in FIG. 18, the viscosity of the resin composition 37 can be suitably adjusted. The viscosity can be adjusted to, for example, around several hundreds of mPa·s to several thousands of mPa·s, without limitation. Suitably adjusting the viscosity of the resin composition 37 to optimize the fluidity of the resin composition 37 allows for the formation of the quantum dot layer 2 with a generally uniform thickness on a surface of the resin film 10.

In the production process shown in FIG. 18, the quantum dot layer 2 is formed by application to a surface of the resin film 10; alternatively, the resin films 10 and 11 may be stuck to both surfaces of the molding of the quantum dot layer 2 having previously been formed. The quantum dot layer 2 may be formed using a method such as injection molding, extrusion molding, blow molding, thermoforming, compression molding, calendaring, blown film extrusion, or casting. The thickness of the molding of the quantum dot layer 2 cart be around 10 μm to 500 μm. For example, the molding of the quantum dot layer 2 can be formed with a thickness of approximately 300 μm. The resin films 10 and 11 can be stuck to both sides of the molding of the quantum dot layer 2 by thermocompression bonding, etc. Note that adhesive layers may be provided between the quantum dot layer 2 and the resin films 10 and 11.

Methods for making the wavelength converting member 1 into a film include methods using a coating machine and methods using a molding machine. Curing methods using a coating machine include UV curing and heat curing.

In this embodiment, the resin films 10 and 11 having a moisture vapor transmission rate of less than 9 g/($m^2$·d) can suitably and easily be placed on both sides of the quantum dot layer 2. This makes it possible to easily produce a wavelength converting member 1 which allows change in the light emission intensity to be effectively inhibited as compared with conventional techniques.

Figure 19:
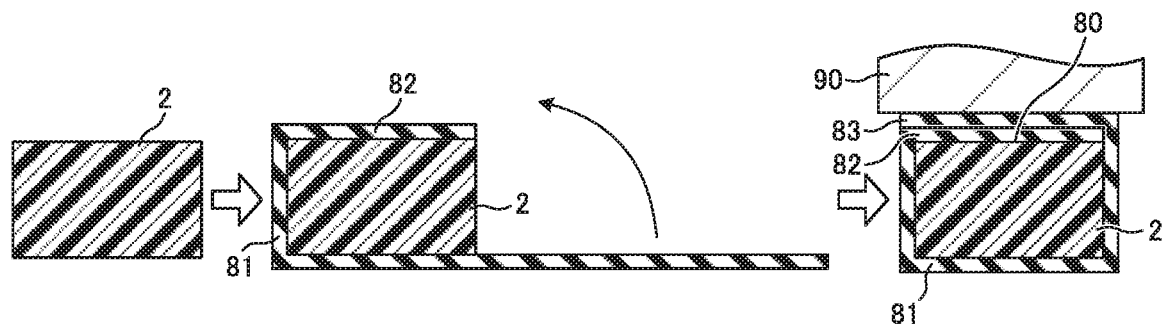
FIG. 19 is a conceptual diagram for illustrating a method of producing a wavelength converting member of the eighth embodiment of the present invention.

Next, a method of producing the wavelength converting member in FIG. 8 will be described with reference to FIG. 19. FIG. 19 is a conceptual diagram for illustrating a method of producing a wavelength converting member of the eighth embodiment of the present invention. As shown in the left diagram in FIG. 19, for example, the quantum dot layer 2 is formed from a molding. Next, in the middle diagram in FIG. 19, the barrier layer 81 is placed on the entire periphery of the quantum dot layer 2. Further, as shown in the right diagram in FIG. 19, the wrap starting end 82 and the wrap finishing end 83 overlap on one side (top surface 80 in FIG. 19) of the quantum dot layer 2 and the wrap starting end 82 and the wrap finishing end 83 are thermocompression bonded using a thermocompression bonding member 90. Thermocompression bonding can be performed for example by while heating, pressing the wrap starting end 82 and the wrap finishing end 83 or joining them under pressure using rollers. Alternatively, the wrap starting end 82 and the wrap finishing end 83 can be joined using an adhesive instead of thermocompression bonding. The production method shown in FIG. 19 enables easily and suitably covering the entire periphery of the quantum dot layer 2 with the barrier layer 81.

Figure 20:
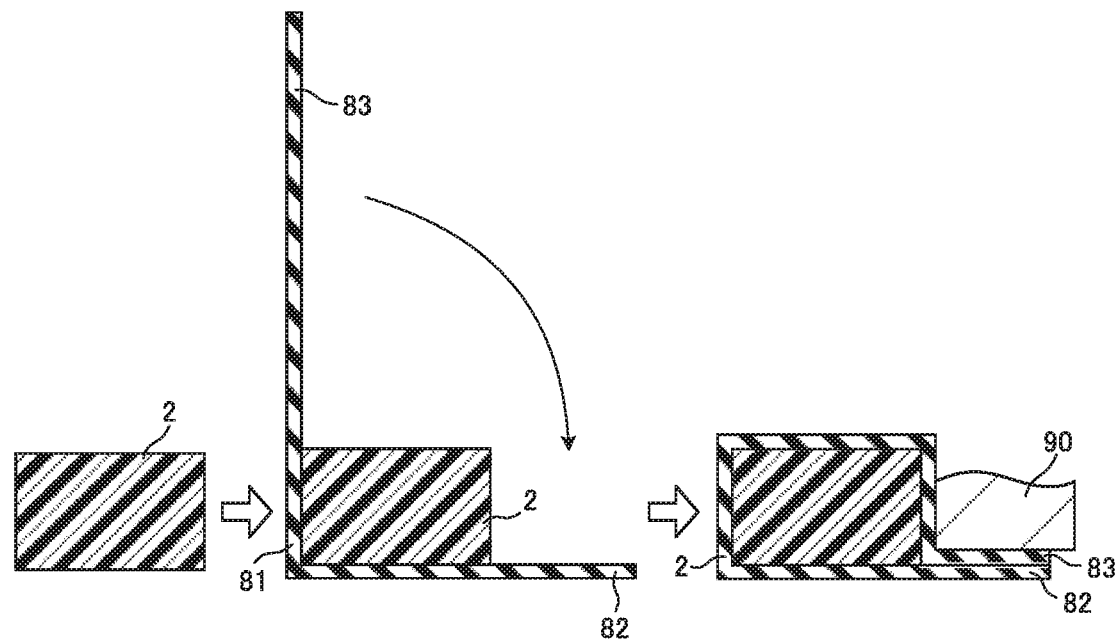
FIG. 20 is a conceptual diagram for illustrating a method of producing a wavelength converting member of the ninth embodiment of the present invention.

A method of producing the wavelength converting member in FIG. 9 will be described with reference to FIG. 20. FIG. 20 is a conceptual diagram for illustrating a method of producing a wavelength converting member of the ninth embodiment of the present invention. As shown in the left diagram in FIG. 20, for example, the quantum dot layer 2 is formed from a molding. In the middle diagram in FIG. 20, with the wrap starting end 82 of the barrier layer 81 being located at an edge on one side of the quantum dot layer 2, the barrier layer 81 is wrapped around the quantum dot layer 2, and the wrap starting end 82 and the wrap finishing end 83 overlap at the edge of the quantum dot layer 2 as shown in the right diagram of FIG. 20. The wrap starting end 82 and the wrap finishing end 83 are then thermocompression bonded using thermocompression bonding member 90. As shown in FIG. 20, the wrap starting end 82 and the wrap finishing end 83 of the barrier layer 81 overlap at an edge on one side of the quantum dot layer 2, which can reduce effects caused by joining the wrap starting end 82 and the wrap finishing end 83 for example by thermocompression bonding on the quantum dot layer 2 (thermal effects, etc.). Thus, the quantum dot layer 2 can be prevented from being deteriorated in the step of forming the barrier layer 81. Note that the wrap starting end 82 and the wrap finishing end 83 may be joined by bonding.

Figure 21A:
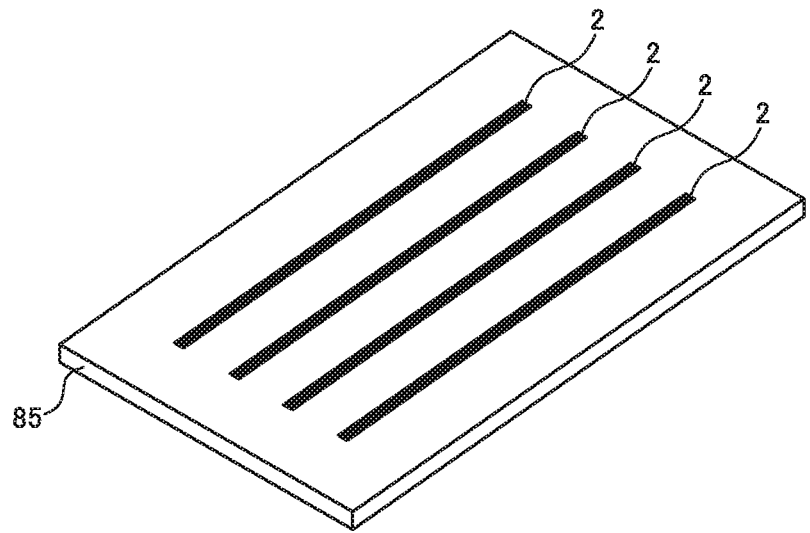
FIGS. 21A and 21B are a conceptual diagram for illustrating a method of producing a wavelength converting member of the tenth embodiment of the present invention.

A method of producing the wavelength converting member in FIG. 10 will be described with reference to FIG. 21. FIG. 21 is a conceptual diagram for illustrating a method of producing a wavelength converting member of the tenth embodiment of the present invention. In the step shown in FIG. 21A, a plurality of the quantum dot layers 2 are placed at intervals on the barrier layer 85. For example, the quantum dot layers 2 are each formed from a molding, and the plurality of the quantum dot layers 2 are arranged on the barrier layer 85. Here, the quantum dot layers 2 are preferably fixed to the barrier layer 85 by bonding.

Figure 21B:
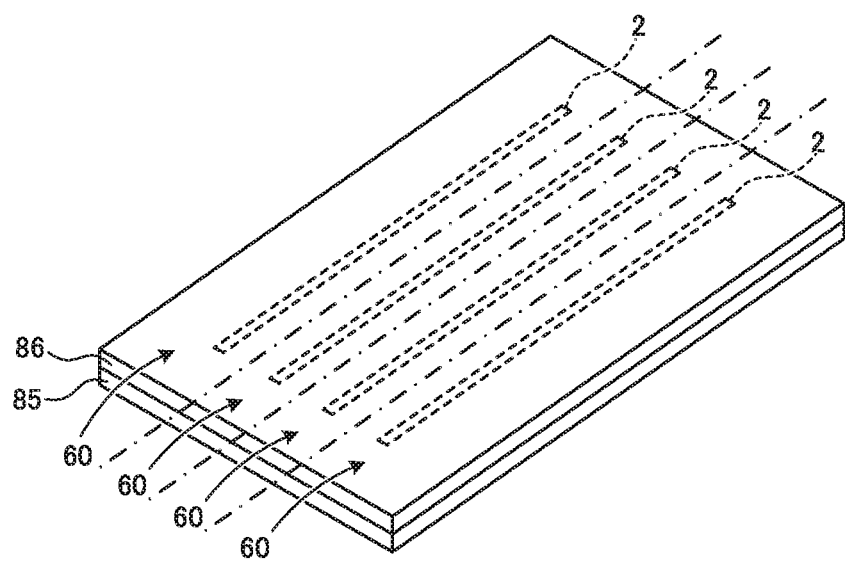

Subsequently, in the step shown in FIG. 21B, the barrier layer 86 is placed over the surface of the barrier layer 85 and the quantum dot layers 2. Preferably, an adhesive layer is previously applied to the inner surface of the barrier layer 86 (facing the barrier layer 85 and the quantum dot layers 2), and the barrier layer 85 is stuck to the barrier layer 86 with the quantum dot layers 2 therebetween. Alternatively, the barrier layer 85 and the barrier layer 86 can be stuck together by thermocompression bonding. As shown by the chain lines in FIG. 21B, the joined barrier layers 85 and 86 are cut between the adjacent quantum dot layers 2 thereby isolating the quantum dot layers 2. Thus, a plurality of the wavelength converting members 60 can be obtained at the same time.

According to the method of producing the wavelength converting member 60 shown in FIG. 21, since the barrier layers 85 and 86 overlap, the barrier layers can be placed on the entire periphery of the quantum dot layers 2, so that the wavelength converting members 60 in each of which the barrier layer is formed on the entire periphery of the quantum dot layers 2 can be easily and suitably produced, and the method is suitable for mass production of the wavelength converting members 60.

Using the production methods shown in FIG. 19 to FIG. 21, the entire periphery of the quantum dot layer(s) 2 can be covered by the barrier layer, the entire periphery of the quantum dot layer(s) 2 can be suitably protected by the barrier layer(s), and the durability can be more effectively improved. Thus, deterioration of the quantum dot layer(s) 2 can be more suitably suppressed.

For example, the quantum dot layers(s) 2 shown in FIG. 19 to FIG. 21 are formed from a molding; alternatively, the quantum dot layer(s) 2 may be formed by inkjet printing as shown in FIG. 11 to FIG. 13. In the case of inkjet printing, a resin composition in which quantum dots are dispersed is discharged onto the top of the barrier layer by inkjet printing. The discharged resin composition is preferably heated for stabilization. The heating temperature is preferably 30° C. to 80° C. and more preferably 30° C. to 50° C.

In this embodiment, the resin films 10 and 11 (barrier layers) each have an organic layer, and it is preferable that the organic layer abuts the quantum dot layer(s) 2 in the production process. Thus, the quantum dot layer(s) 2 can be formed on a surface of the organic layer with high wettability, the quantum dot layer(s) 2 can be formed more easily, and the adhesion between the barrier layer and the quantum dot layer(s) 2 can be improved due to the affinity therebetween.

Further, the layered structure of the resin films 10 and 11 each having a plurality of organic layers and an inorganic layer provided between the organic layers allows the organic layers to be placed on both surfaces of the resin films 10 and 11. This improves handling, and allows for easier formation of the quantum dot layer 2 on the surfaces of the resin films 10 and 11. In addition, the inorganic layers included in the barrier layers make it possible to effectively improve barrier properties of the resin films 10 and 11 (barrier layers).

Alternatively, the resin films 10 and 11 can each have a layered structure composed of a plurality of inorganic layers and an organic layer provided between the inorganic layers. Further, a plurality of resin films can be placed by being stacked. In this case, the resin films 10 and 11 can be joined by sticking them together using an adhesive or by thermocompression bonding.

EXAMPLES

The present invention will be described in detail below with Examples and Comparative Examples performed to demonstrate the effects of the present invention. Note that the present invention is not limited to the following examples.

In Sample 1 to Sample 8 of Examples, an elastomer was dissolved in organosilane, thereby obtaining a QD ink (resin composition) in which quantum dots having a fluorescence wavelength of approximately 520 nm (green) (also referred to as "green quantum dots") were dispersed. For the elastomer, HYBRAR® 7311 from KURARAY CO., LTD. was used.

A laminate of glass-QD ink-barrier layer was obtained. Heat treatment was performed to evaporate the solvent of the QD ink, thereby obtaining a quantum dot layer. In this case, the following structure was employed for the barrier layer.

<Sample 1>
A barrier layer formed as a film having a three-layer structure of PET film-$SiO_2$ layer-PET film with a moisture vapor transmission rate of $6\times10^{-3}$ g/($m^2$·d). The thickness of the barrier layer was 49 μm, <Sample 2>
A barrier layer having a three-layer structure of PET film/$SiO_2$ layer/PET film with a moisture vapor transmission rate of 9 g/($m^2$·d). The thickness of the barrier layer was 50 μm.

<Sample 3>
A cyclic olefin-based film.

Laminates using the barrier layers of Sample 1 to Sample 3 above were subjected to an endurance test under conditions of temperature: 60° C. and humidity: 90%. The light emission intensity was measured using a total luminous flux measurement system available from Otsuka Electronics Co., Ltd. by measuring the total luminous flux of the light caused in each sample by blue (wavelength: 450 nm) LED excitation light.

Figure 23:
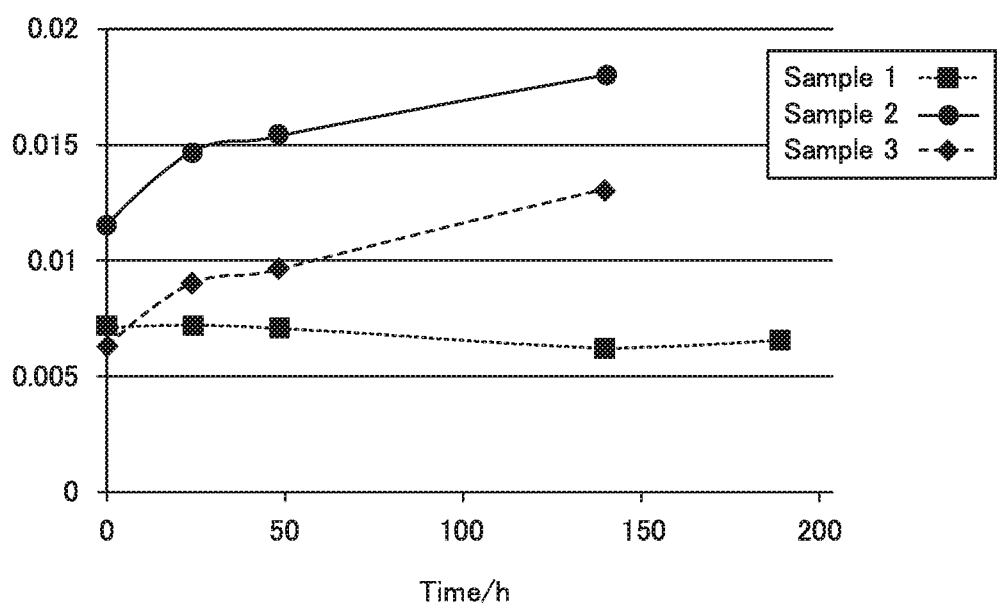
FIG. 23 is a graph showing the relationship between the elapsed time and the blue light intensity (450 nm area) for each sample.

FIG. 23 is a graph showing the relationship the elapsed time and the blue light intensity (450 nm area) for each sample. Here, the blue light intensity corresponds to the area of the emission peak observed at a wavelength of 450 nm.

As shown in FIG. 23, the blue light intensity (450 nm area) was found to gradually increase over time in Sample 2 and Sample 3. In other words, that the intensity of blue light was found to increase over time in Sample 2 and Sample 3. On the other hand, it was found that the blue light intensity (450 nm area) was constant in Sample 1, and the light intensity of blue light did not change over time. Further, it was found for Sample 1 that while the initial blue light intensity (time: 0 h) and the blue light intensity after 150 hours were 0.0075 (time: 0 h) and 0.0070 (150 h), respectively; thus, the blue light intensity hardly changed, and the change in the blue light intensity was within 10%. Here, the change in the blue light intensity is represented by [(initial blue light intensity−blue light intensity after 150 hours)/initial blue light intensity]×100(%) (absolute value).

Figure 24:
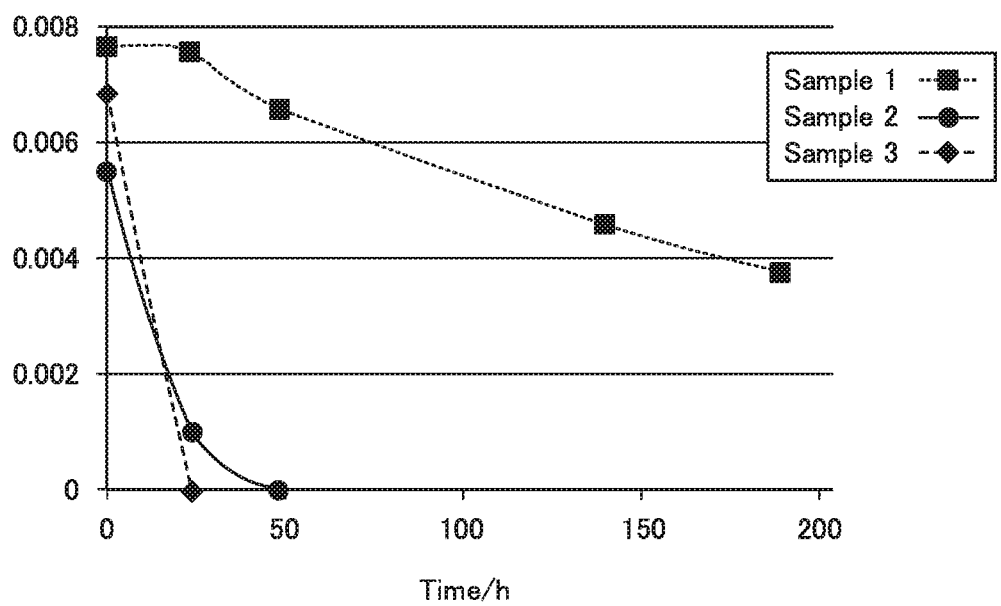
FIG. 24 is a graph showing the relationship the elapsed time and the green light intensity (green area) for each sample.

FIG. 24 is a graph showing the relationship the elapsed time and the green light intensity (green area) for each sample. Here, the green light intensity corresponds to the area of the emission peak observed at a wavelength of 520 nm. As shown in FIG. 24, in Sample 2 an Sample 3, the green light intensity (green area) was found to rapidly decrease over time. The increased blue light intensity and the reduced green light intensity as in Sample 2 and Sample 3 mean that the green quantum dots deteriorated over time. On the other hand, it was found for Sample 1 that the blue light intensity (450 nm area) did not change over time, and the reduction in the green light intensity (green area) over time was successfully made smaller compared with Sample 2 and Sample 3. Further, it was found for Sample 1 that the initial green light intensity (time: 0 h) and the green light intensity after 150 hours were 0.0078 (time: 0 h) and 0.0039 (150 h), respectively; thus, the change over time was smaller compared with Sample 2 and Sample 3, and the change in the green light intensity was within 50%. Here, the change in the green light intensity is represented by [(initial green light intensity−green light intensity after 150 hours)/initial green light intensity]×100(%) (absolute value).

The measurement results presented in FIG. 23 and FIG. 24 show that deterioration of the quantum dots can be suitably suppressed with the use of the barrier layer of Sample 1, thereby effectively inhibiting the change in the light emission intensity over time. Based on the measurement results shown in FIG. 23 and FIG. 24, the moisture vapor transmission rate of the barrier layer was set to a value lower than 9 g/(m²·d). Further, the moisture vapor transmission rate range of the barrier layer of Sample 1, that is, $6 \times 10^{-3}$ g/(m²·d) or less is assumed to be the most preferable range.

Subsequently, the barrier films were evaluated. In the evaluation, barrier layers of Sample 1 above, Sample 5 in which the moisture vapor transmission rate was $1.6 \times 10^{-2}$ g/(m²·d), and Sample 6 in which the moisture vapor transmission rate was $8.4 \times 10^{-3}$ g/(m²·d) were used. The light transmittance (%) was 86.8 (total light) for Sample 1, 92.5 (wavelength: 450 nm) for Sample 5, and 90.6 (wavelength: 450 nm) for Sample 6.

Figure 25:
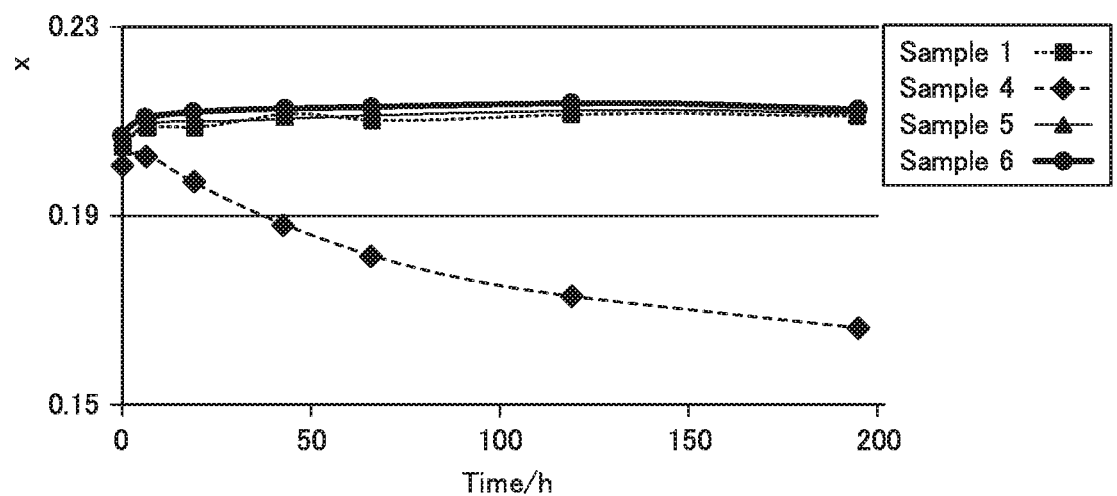
FIG. 25 is a graph showing the relationship the elapsed time and the x-coordinate of the CIE color space chromaticity diagram for each sample.

FIG. 25 is a graph showing the relationship the elapsed time and the x-coordinate of the CIE color space chromaticity diagram for each sample. Sample 4 is a sample without barrier layers (the quantum dot layer formed from a molding).

In the evaluation, both sides of the quantum dot layer were sandwiched between the barrier films of the above samples, and light emitting devices (LEDs) were placed on the side of one of the barrier films with a diffuser panel provided therebetween. Measurements were performed from the side of the other barrier film using a spectrometer.

Figure 22:
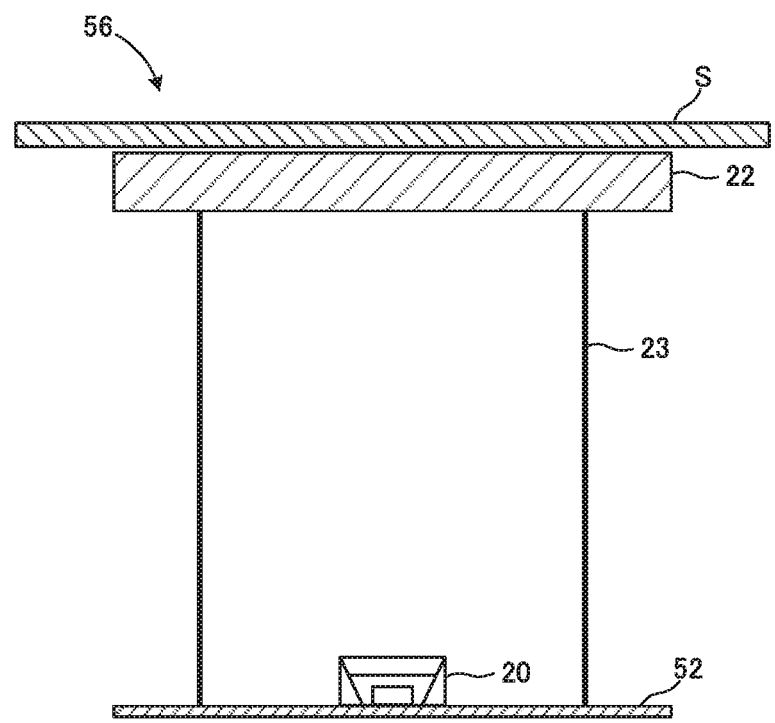
FIG. 22 is a schematic view of a light emission testing unit used in experiments.

FIG. 22 is a schematic view of a light emission testing unit used in experiments. Part of the light emission testing unit is shown by a longitudinal sectional view. As shown in FIG. 22, a light emission testing unit 56 was provided with the light emitting devices 20 (LEDs) and Sample S being placed in a position facing the light emitting devices 20. Each sample in the experiments was a sheet, in which a quantum dot layer was sandwiched between the above barrier films, and the end faces of the barrier films were bonded for example with an epoxy bond and stuck together using aluminum tape. The light emitting devices 20 were supported on a surface of the support 52, and a diffuser panel 22 was provided between the light emitting devices 20 and Sample S. All sides of the light emitting devices 20 were surrounded by a cylindrical reflective sheet 23, and the diffuser panel 22 was placed on the top of the reflective sheet 23. The light emitted from the light emitting devices 20 was diffused by the diffuser panel 22 and entered Sample S. The reflective sheet 23 had a box shape with an opening of for example 3 cm square, and the reflective sheet 23 had a height (distance of the diffuser panel 22 from the support 52) of for example 4 cm. The light emitted from the light emitting devices 20 was then made to enter Sample S through the diffuser panel 22, and the light output from the top of Sample S was measured using the total luminous flux measurement system. Note that the experiment was performed under conditions of temperature: 60° C. and humidity: 90%. Using the light emission testing unit 56 shown in FIG. 22, the light emission intensity of the light emitting devices 20 through Sample S can be accurately measured.

As shown in FIG. 25, the x-coordinate did not change over time for Samples 1, 5, and 6 except for Sample 4 without barrier layers. In Sample 1 and Sample 5, the initial x-coordinate (time: 0 h) and the x-coordinate after 200 hours were 0.208 (time: 0 h) and 0.210 (200 h), respectively; thus, the change in the x-coordinate was found to be within 1%. in Sample 6, the initial x-coordinate (time: 0 h) and the x-coordinate after 200 hours were 0.210 (time: 0 h) and 0.213 (200 h), respectively; thus, the change in the x-coordinate was found to be within 2%. Here, the x-coordinate change is represented by [(initial x-coordinate−x-coordinate after 200 hours)/initial x-coordinate]×100(%) (absolute value)

Figure 26:
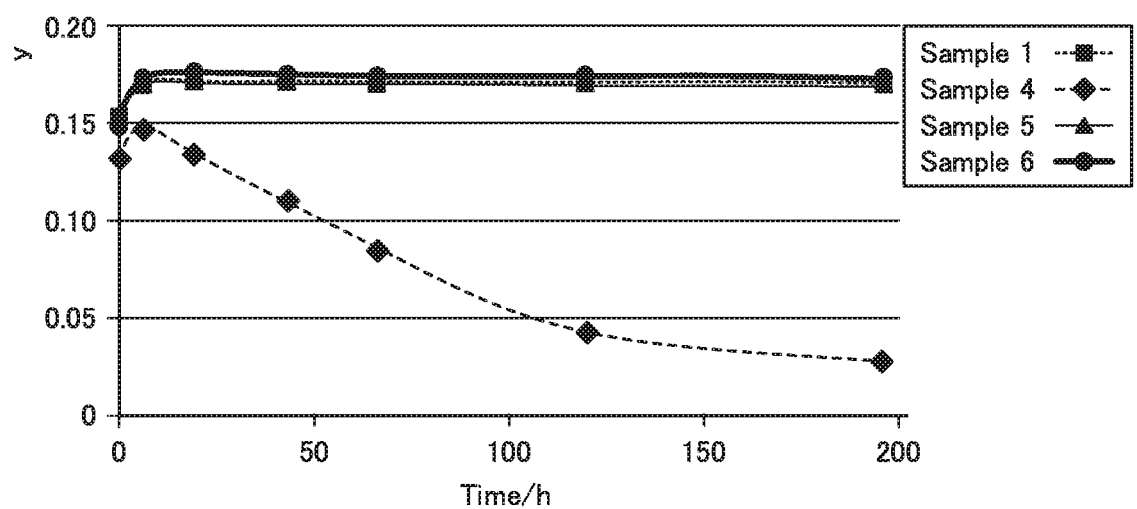
FIG. 26 is a graph showing the relationship the elapsed time and the y-coordinate of the OE color space chromaticity diagram for each sample.

FIG. 26 is a graph showing the relationship the elapsed time and the y-coordinate of the CIE color space chromaticity diagram for each sample. As shown in FIG. 26, the y-coordinate did not change over time in Samples 1, 5, and 6 except for Sample 4 without barrier layers. In Sample 1 and Sample 5, the initial y-coordinate (time: 0 h) and the y-coordinate after 200 hours were 0.170 (time: 0 h) and 0.190 (200 h), respectively; thus, the change in the y-coordinate was found to be within 15%. In Sample 6, the initial y-coordinate (time: 0 h) and the y-coordinate after 200 hours were 0.170 (time: 0 h) and 0.195 (200 h), respectively; thus, the change in the y-coordinate was found to be within 15%. Here, the y-coordinate change is represented by [(initial y-coordinate−y-coordinate after 200 hours)/initial y-coordinate]×100(%) (absolute value).

Figure 27:
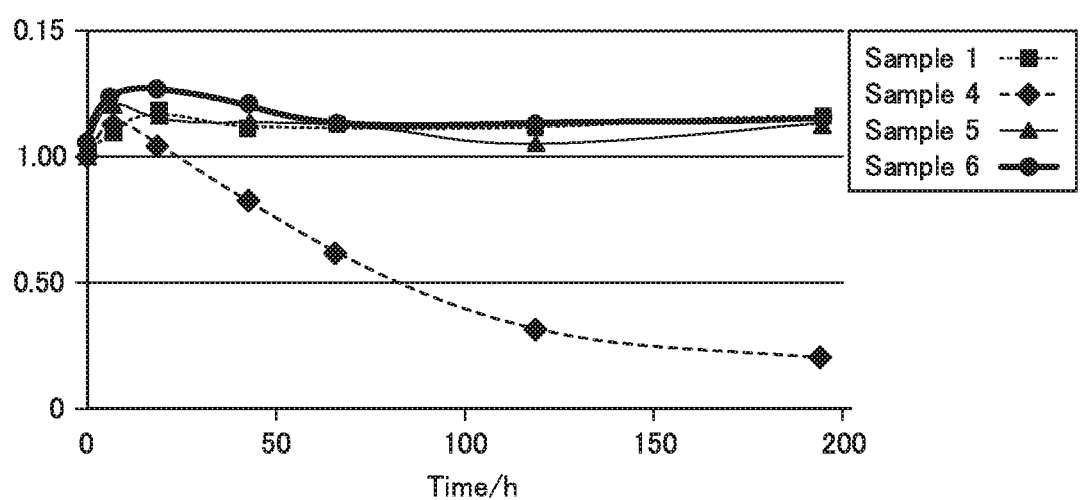
FIG. 27 is a graph showing the relationship the elapsed time and the normalized illumination for each sample.

FIG. 27 is a graph showing the relationship the elapsed time and the normalized illumination for each sample. As shown in FIG. 27, the normalized illumination did not change over time in Samples 1, 5, and 6 except for Sample 4 without barrier layers. In this result, the normalized illumination changed by ±30% over 200 hours.

Next, a barrier layer having a moisture vapor transmission rate of $10^{-2}$ g/(m²·d) was used as Sample 7, and a barrier layer having a moisture vapor transmission rate of $10^{-1}$ g/(m²·d) was used as Sample 8. The moisture vapor transmission rates of the barrier layers had the nominal values. Further, a sheet described in the description of FIG. 22 above was formed and the spectrum was measured over time using the light emission testing unit of FIG. 22.

Figure 28:
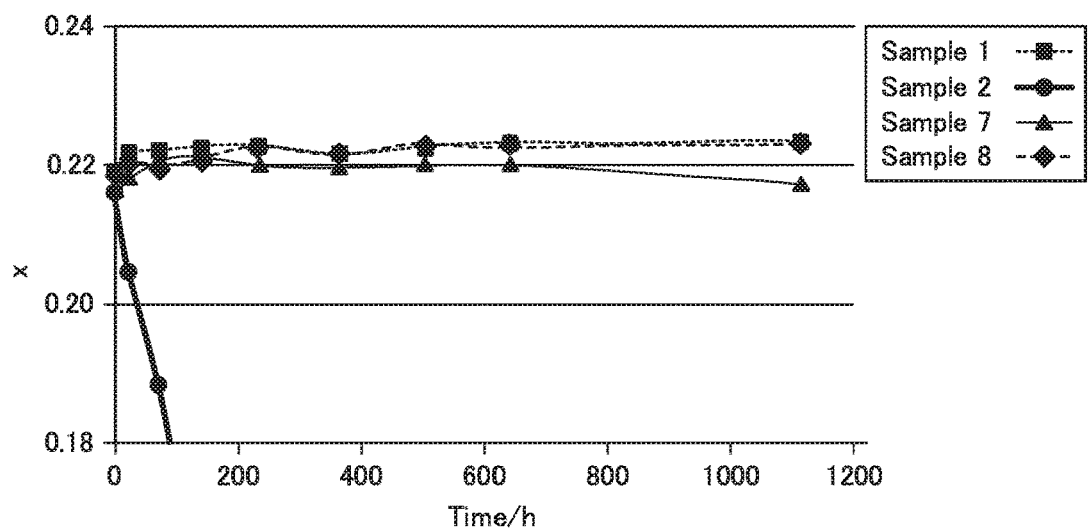
FIG. 28 is a graph showing the relationship the elapsed time and the x-coordinate of the CIE color space chromaticity diagram for each sample.

FIG. 28 is a graph showing the relationship the elapsed time and the x-coordinate of the CIE color space chromaticity diagram for each sample. In the experiments, in addition to Sample 7 and Sample 8, Sample 1 and Sample 2 described above were used.

As shown in FIG. 28, in Sample 2 having a barrier layer with a moisture vapor transmission rate of 9 g/(m²·d), the x-coordinate changed immediately after the start of the experiment. In Sample 1, Sample 7, an Sample 8, in each of which the barrier layer had a moisture vapor transmission rate of $10^{-1}$ g/(m²·d) or less, change in the x-coordinate over time was not observed or was very small. In Sample 1 and Sample 8, the initial x-coordinate (time: 0 h) and the x-coordinate after 1100 hours were 0.220 (time: 0 h) and 0.225 (1100 h), respectively; thus, the change in the x-coordinate was found to be within 5%. In Sample 7, the initial x-coordinate (time: 0 h) and the x-coordinate after 1100 hours were 0.219 (time: 0 h) and 0.219 (1100 h), respectively; thus, the change in the x-coordinate was found to be 0%. Here, the x-coordinate change is represented by [(initial x-coordinate−x-coordinate after 1100 hours)/initial x-coordinate]×100(%) (absolute value)

Figure 29:
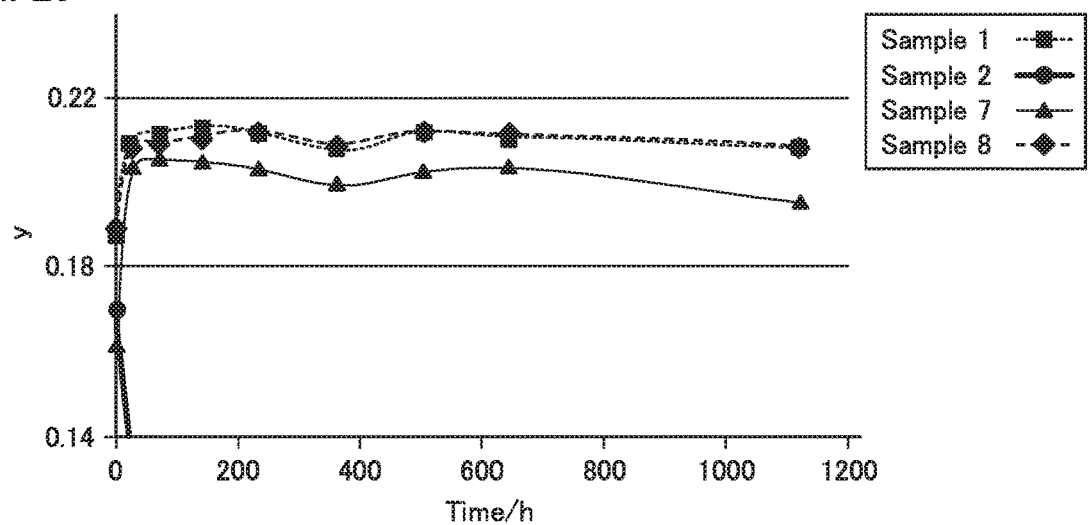
FIG. 29 is a graph showing the relationship the elapsed time and the y-coordinate of the CIE color space chromaticity diagram for each sample.

FIG. 29 is a graph showing the relationship the elapsed time and the y-coordinate of the CIE color space chromaticity diagram for each sample. As shown in FIG. 29, change in the y-coordinate over time was not observed or was very small in Samples 1, 7, and 8 except for Sample 2 having a barrier layer with a moisture vapor transmission rate of 9 g/(m²·d). In Sample 1 and Sample 8, the initial y-coordinate (time: 0 h) and the y-coordinate after 1100 hours were 0.190 (time: 0 h) and 0.210 (1100 h), respectively; thus, the change in the y-coordinate was found to be within 15%. In Sample 7, the initial y-coordinate (time: 0 h) and the y-coordinate after 1100 hours were 0.160 (time: 0 h) and 0.195 (1100 h), respectively; thus, the change in the y-coordinate was found to be within 25%. Here, the y-coordinate change is represented by [(initial y-coordinate−y-coordinate after 1100 hours)/initial y-coordinate]×100(%) (absolute value)

Figure 30:
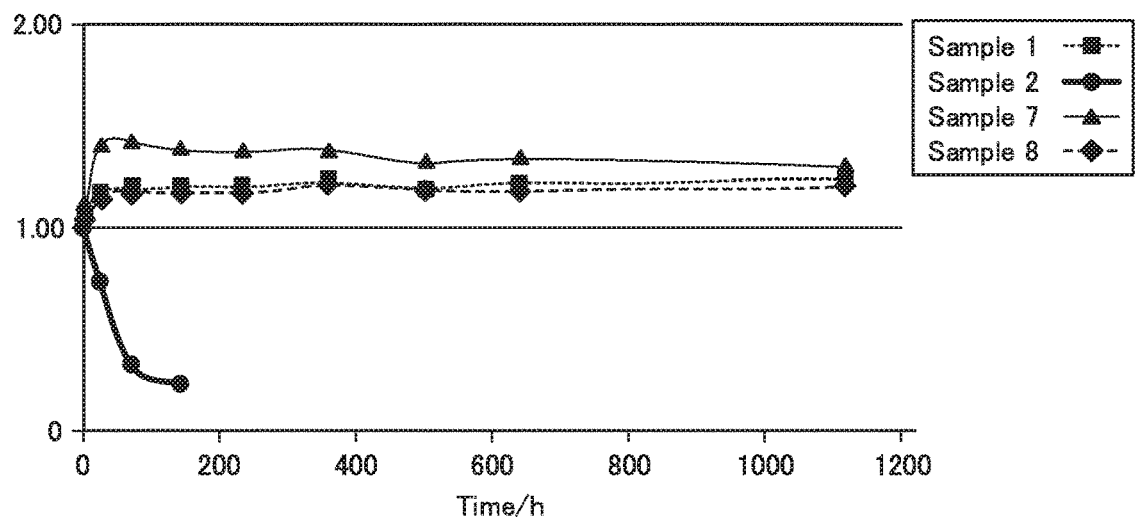
FIG. 30 is a graph showing the relationship the elapsed time and the normalized illumination for each sample.

FIG. 30 is a graph showing the relationship the elapsed time and the normalized illumination for each sample. As shown in FIG. 30, change in the normalized illumination over time was not observed or was very small in Samples 1, 7, and 8 except for Sample 2 having a barrier layer with a moisture vapor transmission rate of 9 g/(m²·d). In this result, the normalized illumination changed by ±30% over 200 hours.

From the above experiments, barrier layer(s) having a moisture vapor transmission rate of approximately 0.1 g/(m²·d) or more were found to sufficiently improve durability. Based on the above, the moisture vapor transmission rate of the barrier layer(s) was preferably set to 0.1 g/(m²·d) or less.

Next, experiments were performed using samples in which the barrier layer was formed around the entire periphery of the quantum dot layer(s). In Sample 9 to Sample 14, a QD ink (resin composition) obtained by dissolving an elastomer in organosilane and dispersing quantum dots having a fluorescence wavelength of approximately 520 nm (green) and quantum dots having a fluorescence wavelength of approximately 650 nm (red) (also referred to as "red quantum dots") therein. For the elastomer, HYBRAR® 7311 from KURARAY CO., LTD. was used. Heat treatment was performed to evaporate the solvent of the QD ink, thereby obtaining a quantum dot layer. For the quantum dot layers used in the experiments, high concentration layers and low concentration layers were prepared. For the barrier layer, a sheet member in which a $SiO_2$ layer was formed on a PET film that had a moisture vapor transmission rate of approximately $10^{-3}$ g/(m²·d) was used. The samples (wavelength converting members) used in the experiments had the following structures.

<Sample 9>
A wavelength converting member constituted by only a quantum dot layer without barrier layers.
<Sample 10>
The wavelength converting member shown in FIG. 8. Note that the wrap starting end and the wrap finishing end of the barrier layer were thermocompression bonded in an overlapping manner on the top surface of the quantum dot layer.
<Sample 11>
The wavelength converting member shown in FIG. 10. Note that the wrap starting end and the wrap finishing end of the barrier layer were thermocompression bonded in an overlapping manner at edges on the sides of the quantum dot layer.

The above samples were subjected to an endurance test under conditions of temperature: 60° C. and humidity: 90%. The light emission intensity was measured using a total luminous flux measurement system available from Otsuka Electronics Co., Ltd. by measuring the total luminous flux of the light caused in each sample by blue (wavelength: 450 nm) LED excitation light. First, the experimental results for Sample 9 to Sample 11 using the low concentration quantum dot layers are described.

Figure 31:
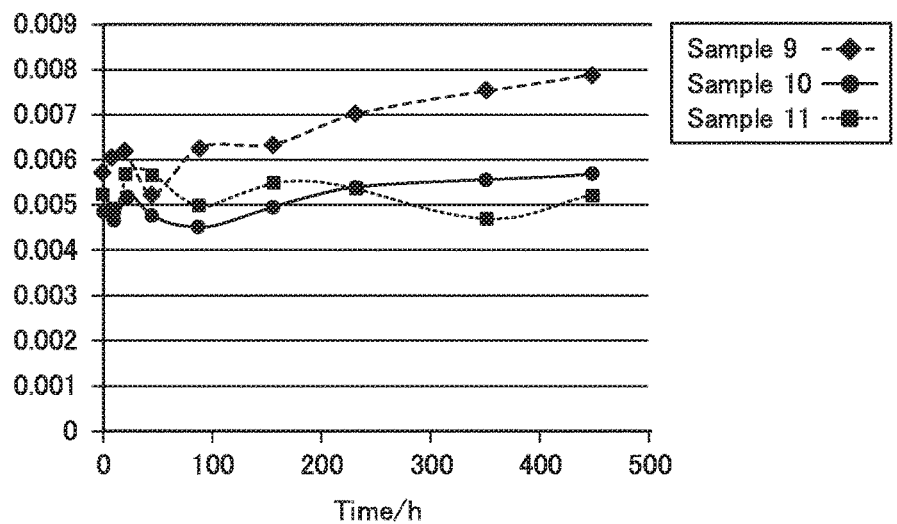
FIG. 31 is a graph showing the relationship the elapsed time and the blue light intensity (450 nm area) for Sample 9 to Sample 11.

FIG. 31 is a graph showing the relationship the elapsed time and the blue light intensity (450 nm area) for Sample 9 to Sample 11. Here, the blue light intensity corresponds to the area of the emission peak observed at a wavelength of 450 nm.

As shown in FIG. 31, the blue light intensity (450 nm area) was found to gradually increase over time in Sample 9. In other words, the intensity of blue light was found to increase over time in Sample 9. On the other hand, it was found that the blue light intensity (450 nm area) stayed constant in Sample 10 and Sample 11, and the light intensity of blue light was kept unchanged over time. Further, the initial blue light intensity (time: 0 h) and the blue light intensity after 450 hours were 0.0049 (time: 0 h) and 0.0056 (450 h), respectively in Sample 10 and were 0.0053 (time: 0 h) and 0.0053 (450 h), respectively in Sample 11. It was found for Sample 10 and Sample 11 that the blue light intensity after 450 hours hardly changed from the initial blue light intensity (time: 0 h), and the change in the blue light intensity was within 15%. Here, the change in the blue light intensity is represented by [(initial blue light intensity−blue light intensity after 450 hours)/initial blue light intensity]× 100(%) (absolute value).

Figure 32:
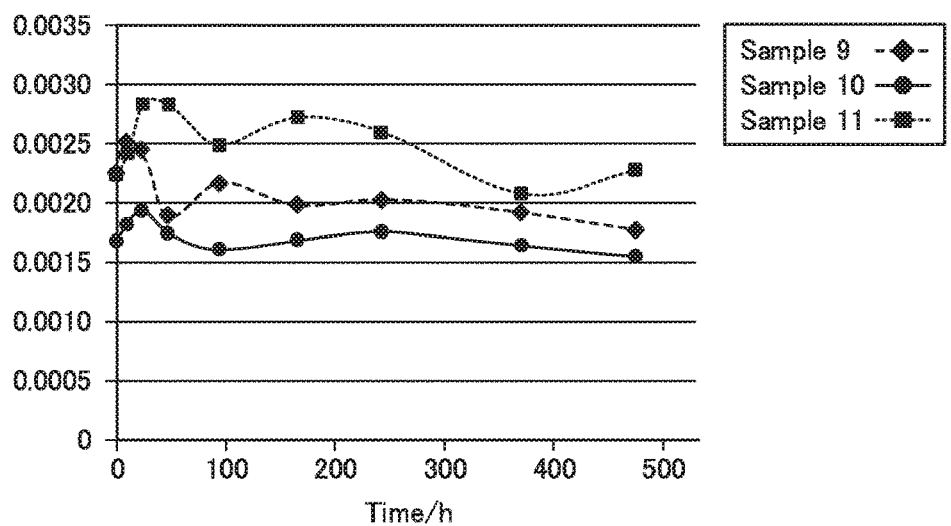
FIG. 32 is a graph showing the relationship the elapsed time and the green light intensity (green area) for Sample 9 to Sample 11.

FIG. 32 is a graph showing the relationship the elapsed time and the green light intensity (green area) for Sample 9 to Sample 11. Here, the green light intensity corresponds to the area of the emission peak observed at a wavelength of 520 nm. As shown in FIG. 32, in Sample 9, the green light intensity (green area) was found to rapidly decrease in 100 hours from the start of the experiment. The increased blue light intensity and the reduced green light intensity as in Sample 9 mean that the green quantum dots deteriorated over time. On the other hand, it was found that the blue light intensity (450 nm area) did not change over time in Sample 10 and Sample 11, and the reduction in the green light intensity (green area) over time was made smaller compared with Sample 9. Further, the initial green light intensity (time: 0 h) and the green light intensity after 450 hours were 0.0017 (time: 0 h) and 0.0016 (450 h), respectively in Sample 10 and were 0.0022 (time: 0 h) and 0.0023 (450 h), respectively in Sample 11. Further, it was found for Sample 10 and Sample 11 that the change from the initial green light intensity (time: 0 h) to the green light intensity after 450 hours was smaller compared with Sample 9, and the change in the green light intensity was within 10%. Here, the change in the green light intensity is represented by [(initial green light intensity−green light intensity after 450 hours)/initial green light intensity]×100(%) (absolute value).

Figure 33:
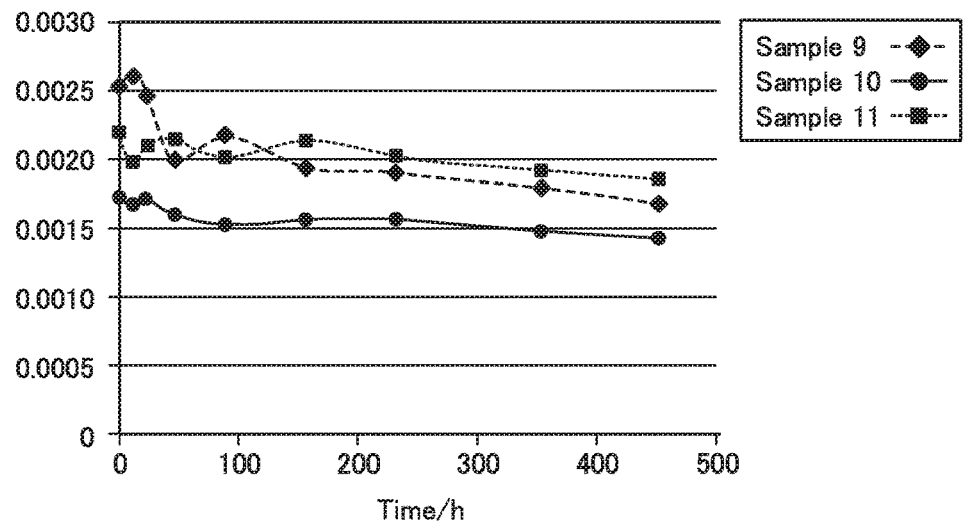
FIG. 33 is a graph showing the relationship the elapsed time and the red light intensity (red area) for Sample 9 to Sample 11.

FIG. 33 is a graph showing the relationship the elapsed time and the red light intensity (red area) for Sample 9 to Sample 11, Here, the red light intensity corresponds to the area of the emission peak observed at a wavelength of 650 nm. As shown in FIG. 33, in Sample 9, the red light intensity (red area) was found to rapidly decrease in 50 hours from the start of the experiment. The increased blue light intensity and the reduced red light intensity as in Sample 9 mean that the red quantum dots deteriorated over time. On the other hand, it was found that the blue light intensity (450 nm area) did not change over time in Sample 10 and Sample 11, and the reduction in the red light intensity (red area) over time was successfully made smaller compared with Sample 9. Further, the initial red light intensity (time: 0 h) and the red light intensity after 450 hours were 0.0017 (time: 0 h) and 0.0014 (450 h), respectively in Sample 10 and were 0.0022 (time: 0 h) and 0.0018 (450 h), respectively in Sample 11. It was found for Sample 10 and Sample 11 that the change from the initial red light intensity (time: 0 h) to the red light intensity after 450 hours was smaller compared with Sample 9, and the change in the red light intensity was within 25%, Here, the change in the red light intensity is represented by [(initial red light intensity−red light intensity after 450 hours)/initial red light intensity]×100(%) (absolute value).

The experimental results presented in FIG. 31 to FIG. 33 show that deterioration of quantum dots can be suitably suppressed by covering the entire periphery of the quantum dot layer with the barrier layer, thereby effectively inhibiting the change in the light emission intensity over time.

Figure 34:
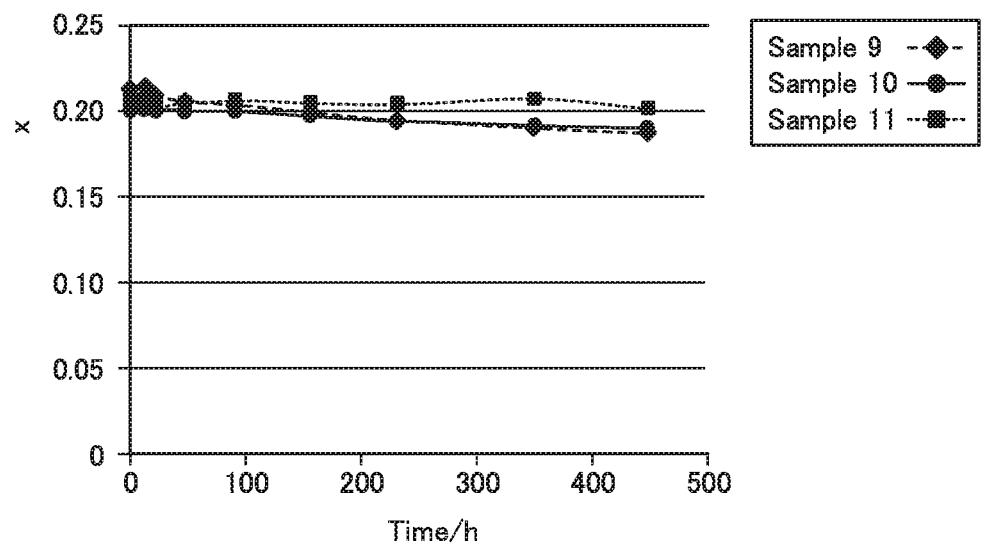
FIG. 34 is a graph showing the relationship the elapsed time and the x-coordinate of the CIE color space chromaticity diagram for Sample 9 to Sample 11.

Subsequently, the barrier films were evaluated. FIG. 34 is a graph showing the relationship the elapsed time and the x-coordinate of the CIE color space chromaticity diagram for Sample 9 to Sample 11.

As shown in FIG. 34, the x-coordinate did not change substantially over time in any of the samples. In Sample 10, the initial x-coordinate (time: 0 h) and the x-coordinate after 450 hours were 0.2013 (time: 0 h) and 0.1892 (450 h), respectively; thus, the change in the x-coordinate was found to be within 10%. In Sample 11, the initial x-coordinate (time: 0 h) and the x-coordinate after 450 hours were 0.2080 (time: 0 h) and 0.1998 (450 h), respectively; thus, the change in the x-coordinate was found to be within 5%. Here, the x-coordinate change is represented by [(initial x-coordinate−x-coordinate after 450 hours)/initial x-coordinate]×100(%) (absolute value).

Figure 35:
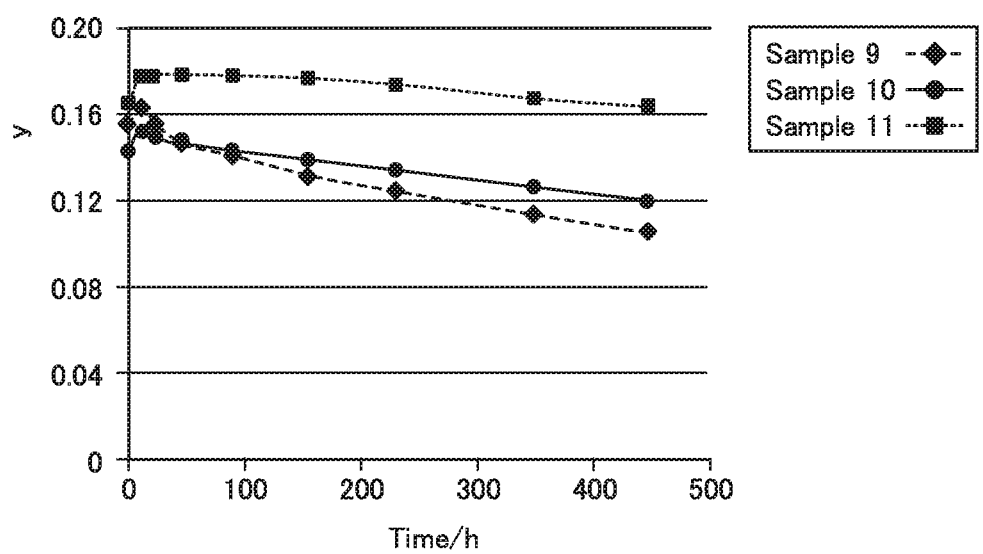
FIG. 35 is a graph showing the relationship the elapsed time and the y-coordinate of the CIE color space chromaticity diagram for Sample 9 to Sample 11.

FIG. 35 is a graph showing the relationship the elapsed time and the y-coordinate of the CIE color space chromaticity diagram for Sample 9 to Sample 11. As shown in FIG. 35, the y-coordinate of Sample 9 that was not provided with barrier layers significantly changed over time as compared with Sample 9 and Sample 10 in which the entire periphery of the quantum dot layer was surrounded by the barrier layer. In Sample 10, the initial y-coordinate (time: 0 h) and the y-coordinate after 450 hours were 0.1428 (time: 0 h) and 0.1210 (450 h), respectively; thus, the change in the y-coordinate was found to be within 20%. In Sample 11, the initial y-coordinate (time: 0 h) and the y-coordinate after 450 hours were 0.1626 (time: 0 h) and 0.1635 (450 h), respectively; thus, the change in the y-coordinate was found to be within 1%. Here, the y-coordinate change is represented by [(initial y-coordinate−y-coordinate after 450 hours)/initial y-coordinate]×100(%) (absolute value).

When Sample 10 and Sample 11 were compared, better results were obtained overall with Sample 11 than with Sample 10. This is probably because in Sample 11, the wrap starting end and the wrap finishing end of the barrier layer were thermocompression bonded at the edges of the quantum dot layer unlike in Sample 10, so that thermal effects on the quantum dot layer were reduced as compared with the structure of Sample 10.

Next, experimental results for Sample 12 to Sample 14 using the high concentration quantum dot layers are described.

<Sample 12>

A wavelength converting member constituted by only a quantum dot layer without barrier layers.

<Sample 13>

The wavelength converting member shown in FIG. 8. Note that the wrap starting end and the wrap finishing end of the barrier layer were thermocompression bonded in an overlapping manner on the top surface of the quantum dot layer.

<Sample 14>

The wavelength converting member shown in FIG. 10. Note that the wrap starting end and the wrap finishing end of the barrier layer were thermocompression bonded in an overlapping manner at edges on the sides of the quantum dot layer.

The above samples were subjected to an endurance test under conditions of temperature: 60° C. and humidity: 90%. The light emission intensity was measured using a total luminous flux measurement system available from Otsuka Electronics Co., Ltd. by measuring the total luminous flux of the light caused in each sample by blue (wavelength: 450 nm) LED excitation light.

Figure 36:
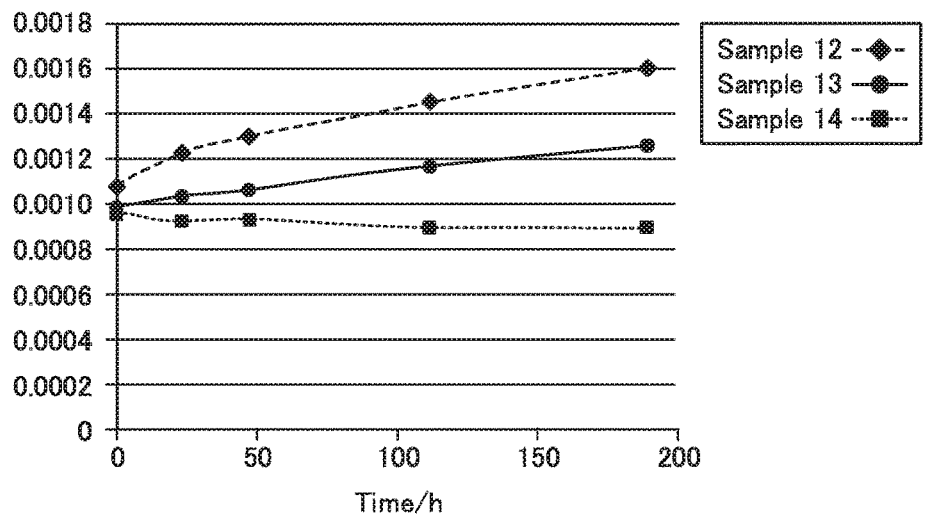
FIG. 36 is a graph of the measurements of the relationship the elapsed time and the blue light intensity (450 nm area) for Sample 12 to Sample 14.

FIG. 36 is a graph of the measurements of the relationship the elapsed time and the blue light intensity (450 nm area) for Sample 12 to Sample 14.

As shown in FIG. 36, the intensity of blue light was found to increase over time in Sample 12. On the other hand, it was found that the blue light intensity (450 nm area) stayed constant in Sample 13 and Sample 14, and the light intensity of blue light was kept unchanged over time. Further, the initial blue light intensity (time: 0 h) and the blue light intensity after 189 hours were 0.0010 (time: 0 h) and 0.0013 (189 h), respectively in Sample 13 and were 0.0010 (time: 0 h) and 0.0009 (189 h), respectively in Sample 14. It was found for Sample 13 and Sample 14 that the blue light intensity after 189 hours hardly changed from the initial blue light intensity (time: 0 h), or the change in the blue light intensity was smaller than that in Sample 12, and the change in the blue light intensity was within 30%. Here, the change in the blue light intensity is represented by [(initial blue light intensity−blue light intensity after 189 hours)/initial blue light intensity]×100(%) (absolute value).

Figure 37:
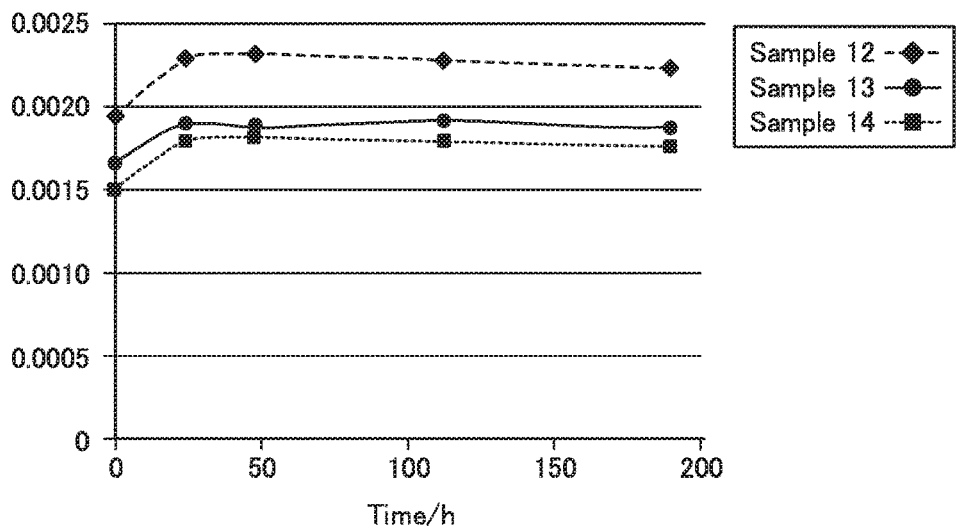
FIG. 37 is a graph showing the relationship the elapsed time and the green light intensity (green area) for Sample 12 to Sample 14.

FIG. 37 is a graph showing the relationship the elapsed time and the green light intensity (green area) for Sample 12 to Sample 14. Here, the green light intensity corresponds to the area of the emission peak observed at a wavelength of 520 nm. As shown in FIG. 36 and FIG. 37, it was found that changes in the blue light intensity (450 nm area) and the green light intensity (green area) over time in Sample 13 and Sample 14 were successfully made smaller compared with Sample 12. Further, the initial green light intensity (time: 0 h) and the green light intensity after 189 hours were 0.0017 (time: 0 h) and 0.0019 (189 h), respectively in Sample 13 and were 0.0015 (time: 0 h) and 0.0018 (189 h), respectively in Sample 14. It was found for Sample 13 and Sample 14 that the change from the initial green light intensity (time: 0 h) to the green light intensity after 189 hours was within 20%. Here, the change in the green light intensity is represented by [(initial green light intensity−green light intensity after 189 hours)/initial green light intensity]×100(%) (absolute value).

Figure 38:
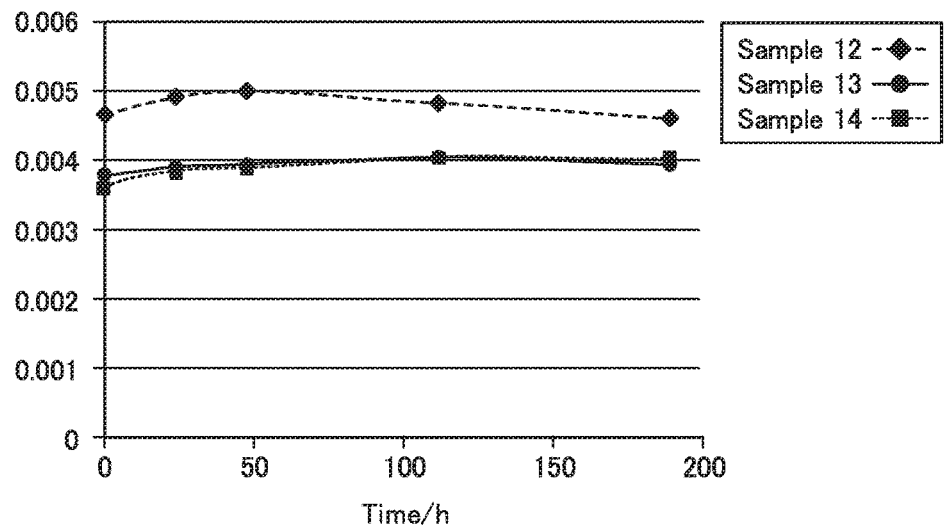
FIG. 38 is a graph showing the relationship the elapsed time and the red light intensity (red area) for Sample 12 to Sample 14.

FIG. 38 is a graph showing the relationship the elapsed time and the red light intensity (red area) for Sample 12 to Sample 14. Here, the red light intensity corresponds to the area of the emission peak observed at a wavelength of 650 nm. As shown in FIG. 36 and FIG. 38, it was found that changes in the blue light intensity (450 nm area) and the red light intensity (red area) over time were successfully made smaller in Sample 13 and Sample 14 compared with Sample 12. Further, the initial red light intensity (time: 0 h) and the red light intensity after 189 hours were 0.0038 (time: 0 h) and 0.0039 (189 h), respectively in Sample 13 and were 0.0037 (time: 0 h) and 0.0040 (189 h), respectively in Sample 14. It was found for Sample 13 and Sample 14 that the change from the initial red light intensity (time: 0 h) to the red light intensity after 189 hours was within 10%. Here, the change in the red light intensity is represented by [(initial red light intensity−red light intensity after 189 hours)/initial red light intensity]×100(%) (absolute value).

The experimental results presented in FIG. 36 to FIG. 38 show that deterioration of the quantum dots can be suitably suppressed by covering the entire periphery of the quantum dot layer with the barrier layer, thereby effectively inhibiting the change in the light emission intensity over time.

Figure 39:
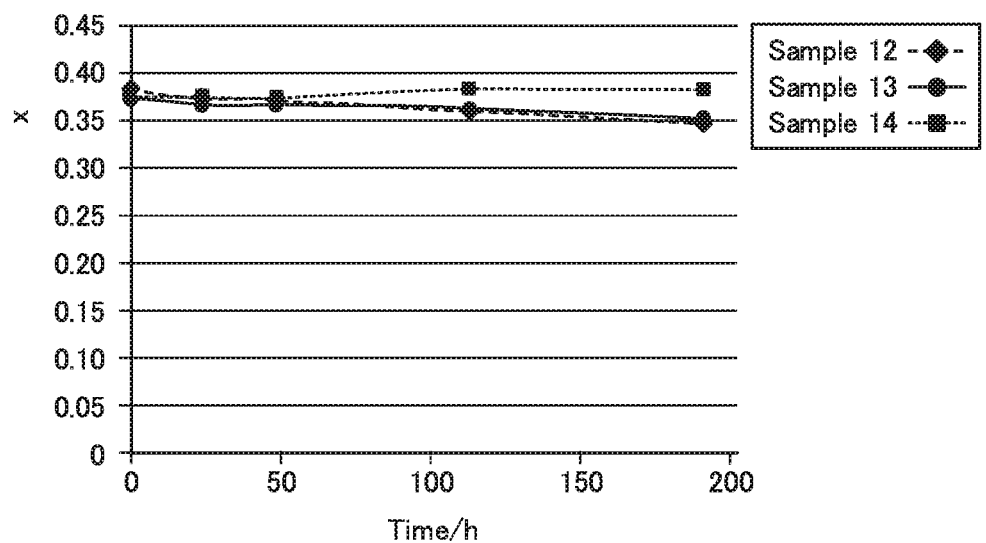
FIG. 39 is a graph showing the relationship the elapsed time and the x-coordinate of the CIE color space chromaticity diagram for Sample 12 Sample 14.
Figure 40:
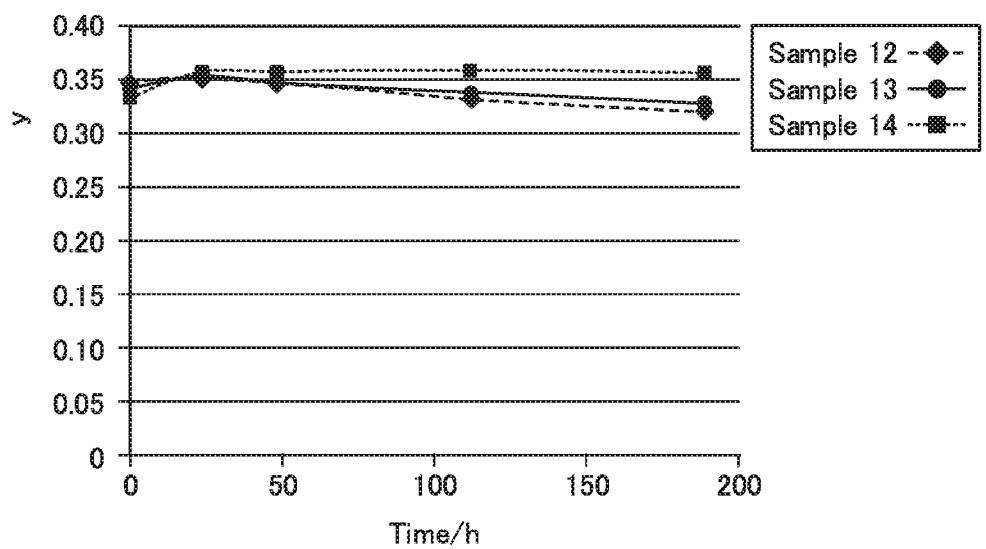
FIG. 40 is a graph showing the relationship the elapsed time and the y-coordinate of the CIE color space chromaticity diagram for Sample 12 to Sample 14.

Subsequently, the barrier films were evaluated. FIG. 39 is a graph showing the relationship the elapsed time and the x-coordinate of the CIE color space chromaticity diagram for Sample 12 to Sample 14. In Sample 13, the initial x-coordinate (time: 0 h) and the x-coordinate after 189 hours were 0.3729 (time: 0 h) and 0.3524 (189 h), respectively; thus, the change in the x-coordinate was found to be within 10%. In Sample 14, the initial x-coordinate (time: 0 h) and the x-coordinate after 189 hours were 0.3748 (time: 0 h) and 0.3811 (189 h), respectively; thus, the change in the x-coordinate was found to be within 5%. Here, the x-coordinate change is represented by [(initial x-coordinate−x-coordinate after 189 hours)/initial x-coordinate]×100(%) (absolute value). FIG. 40 is a graph showing the relationship the elapsed time and the y-coordinate of the CIE color space chromaticity diagram for Sample 12 to Sample 14. In Sample 13, the initial y-coordinate (time: 0 h) and the y-coordinate after 189 hours were 0.3441 (time: 0 h) and 0.3301 (189 h), respectively; thus, the change in the y-coordinate was found to be within 5%. In Sample 14, the initial y-coordinate (time: 0 h) and the y-coordinate after 189 hours were 0.3347 (time: 0 h) and 0.3580 (189 h), respectively; thus, the change in the y-coordinate was found to be within 5%, Here, the y-coordinate change is represented by [(initial y-coordinate−y-coordinate after 189 hours)/initial y-coordinate]×100(%) (absolute value), As shown in FIG. 39 and FIG. 40, changes in the x-coordinate and the y-coordinate over time were smaller in Sample 13 and Sample 14 in which the entire periphery of the quantum dot layer was surrounded by the barrier layer compared with Sample 12 that was not provided with barrier layers.

When Sample 13 and Sample 14 were compared, better results were obtained overall with Sample 13 than with Sample 14. This is probably because in Sample 14, the wrap starting end and the wrap finishing end of the barrier layer were thermocompression bonded at the edges on the sides of the quantum dot layer unlike in Sample 13, so that thermal effects on the quantum dot layer were reduced as compared with the structure of Sample 13.

Figure 41:
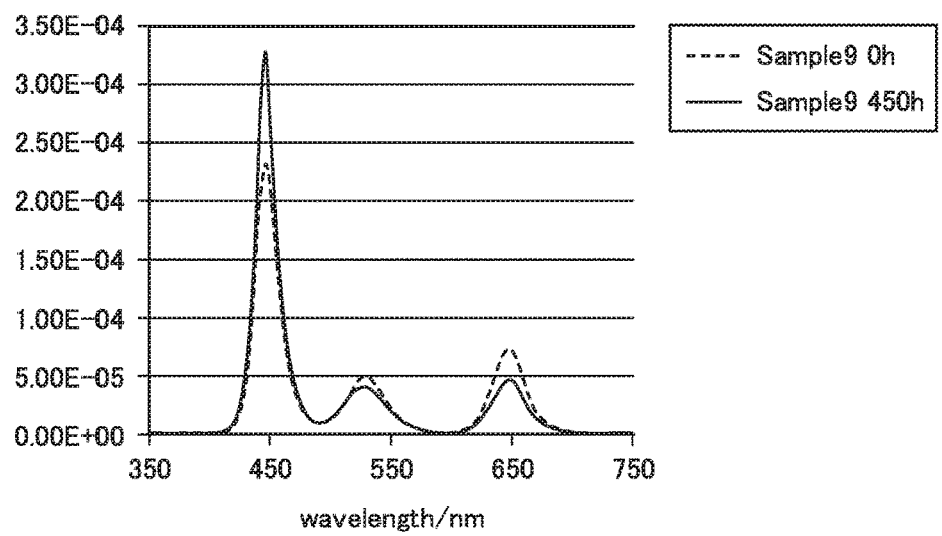
FIG. 41 shows the light emission spectrum for Sample 9.
Figure 42:
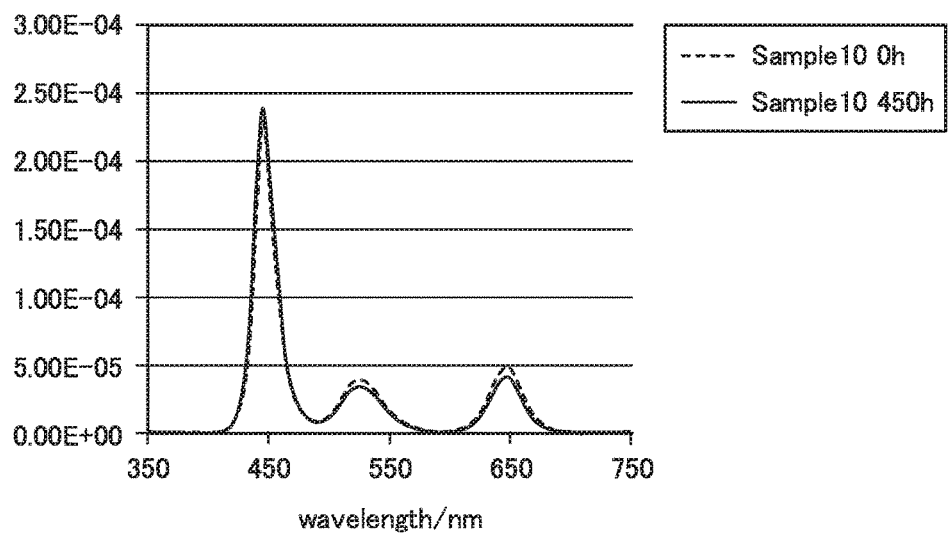
FIG. 42 shows the light emission spectrum for Sample 10.
Figure 43:
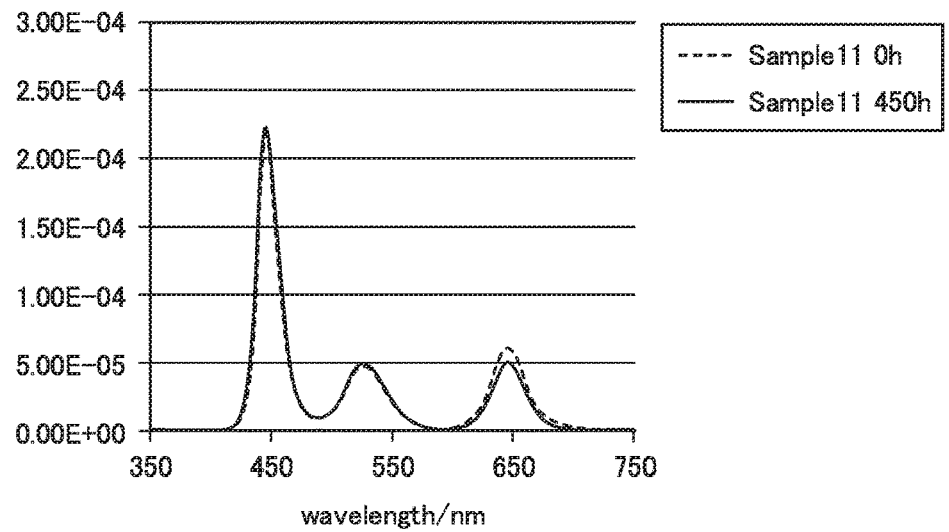
FIG. 43 shows the light emission spectrum for Sample 11.

FIG. 41 to FIG. 43 show the light emission spectrum of light output when blue light of 450 nm was applied to Sample 9 to Sample 11. The horizontal axis represents the wavelength, and the vertical axis represents the light intensity. Each diagram shows the spectra after 0 hours (immediately after the start of the experiment) and after 450 hours. As shown in FIG. 41, in Sample 9, significant change in the spectrum was observed in 450 hours from 0 hours. On the other hand, as shown in FIG. 42 and FIG. 43, in Sample 10 and Sample 11, change in the spectrum in 450 hours from 0 hours was smaller compared with Sample 9. It was found for Sample 10 and Sample 11 that since the barrier layer covered the periphery of the quantum dot layer, deterioration of quantum dots was suitably suppressed; thus, change in the light emission intensity over time was effectively inhibited.

Figure 44:
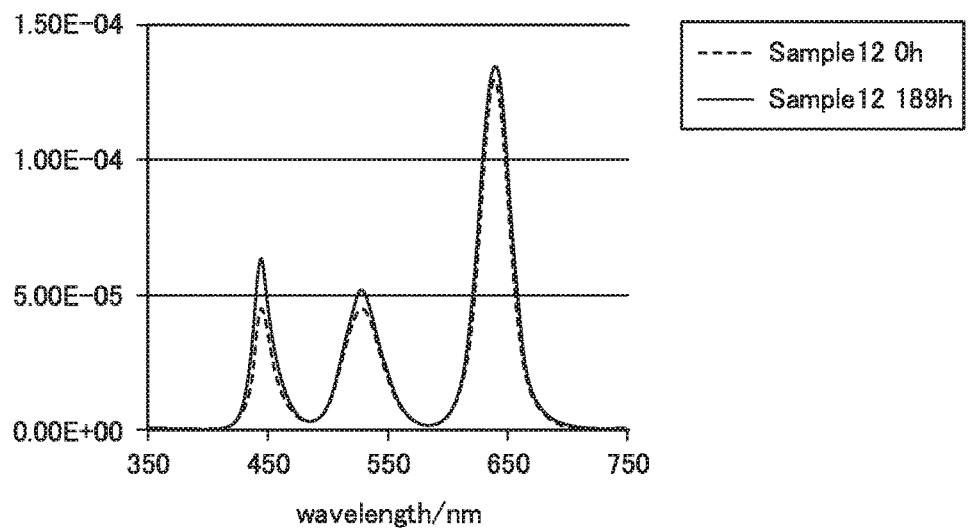
FIG. 44 shows the light emission spectrum for Sample 12.
Figure 45:
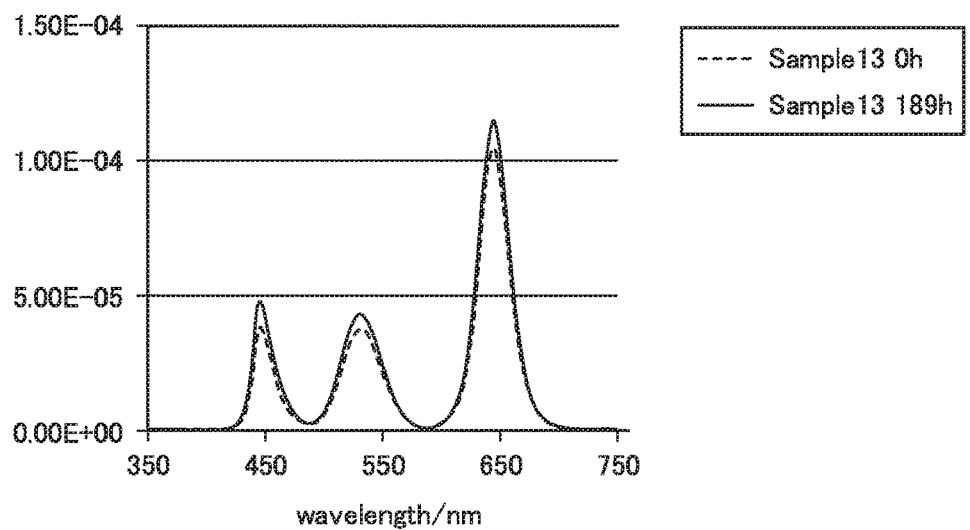
FIG. 45 shows the light emission spectrum for Sample 13.
Figure 46:
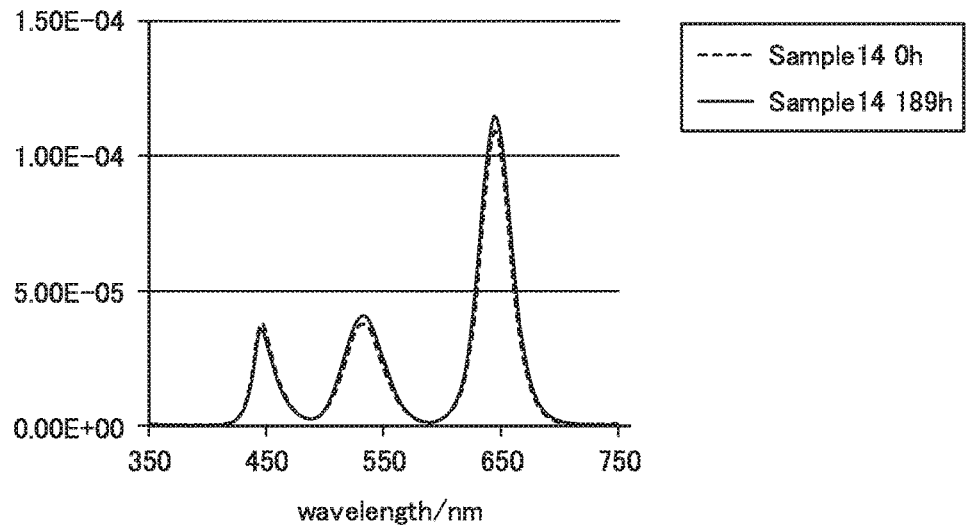
FIG. 46 shows the light emission spectrum for Sample 14.

FIG. 44 to FIG. 46 show the light emission spectrum of light output when blue light of 450 rim was applied to Sample 12 to Sample 14. The horizontal axis represents the wavelength, and the vertical axis represents the light intensity. Each diagram shows the spectra after 0 hours (immediately after the start of the experiment) and after 189 hours. As shown in FIG. 44, in Sample 12, significant change in the spectra was observed in 189 hours from 0 hours. On the other hand, as shown in FIG. 45 and FIG. 46, the change in the spectrum in 189 hours from 0 hours was found to be smaller in in Sample 13 and Sample 14 compared with Sample 12. It was found for Sample 13 and Sample 14 that since the barrier layer covered the periphery of the quantum dot layer, deterioration of quantum dots was suitably suppressed; thus, change in the light emission intensity over time was effectively suppressed.

INDUSTRIAL APPLICABILITY

The present invention can provide a wavelength converting member which makes it possible to effectively inhibit change in the light emission intensity over time; and a back light unit, a light guide member, a display device, and the like that have stable wavelength conversion characteristics can be obtained using the wavelength converting member of the present invention.

This application is based on Japanese patent application No. 2014-263785 filed on Dec. 26, 2014, the content of which is hereby incorporated in its entirety.

What is claimed is:

1. A method of producing a wavelength converting member, the method comprising:
    forming a quantum dot layer including quantum dots on a bottom film, the bottom film including a bottom organic layer;
    forming a top film on the quantum dot layer, the top film including a top organic layer;
    laminating the top film, the quantum dot layer, and the bottom film, so that a first adhesive layer is interposed between and directly contacts the top organic layer and the quantum dot layer and a second adhesive layer is interposed between and directly contacts the bottom organic layer and the quantum dot layer, to form a laminate structure with the bottom organic layer and the top organic layer facing the quantum dot layer; and
    fixing the quantum dot layer to the bottom organic layer and fixing the quantum dot layer to the top organic layer, with the laminate structure sandwiched between a pair of rolls, by thermocompression bonding and bonding via the first adhesive layer and the second adhesive layer to bond the laminate structure at interfaces between the top organic layer and the quantum dot layer, and between the quantum dot layer and the bottom organic layer,
    wherein a moisture vapor rate (WVTR) of the top film and the bottom film is 0.006 (g/m$^2$·day)≤WVTR<9 (g/m$^2$·day),
    wherein the quantum dot layer includes the quantum dots, a resin in which the quantum dots are dispersed, a dispersant, and 1 to 10 wt % of a light-scattering agent with respect to the quantum dot layer,
    wherein the dispersant is a material which is different from that of the resin and improves dispersibility of the quantum dots in the resin,
    wherein a change in an x-coordinate of a CIE color space chromaticity diagram of the wavelength converting member, under conditions of a temperature of 60° C. and a humidity of 90%, is within 5%,
    wherein a change in a y-coordinate of a CIE color space chromaticity diagram of the wavelength converting member, under conditions of a temperature of 60° C. and a humidity of 90%, is within 15%,
    wherein the change in the x-coordinate is represented by [(initial x-coordinate−x-coordinate after 200 hours)/initial x-coordinate]×100(%) (absolute value), and
    wherein the change in the y-coordinate is represented by [(initial y-coordinate−y-coordinate after 200 hours)/initial x-coordinate]×100(%)(absolute value), wherein a change in a blue light intensity, corresponding to an area of an emission peak measured at a wavelength of 450 nm, after 150 hours relative to the blue light intensity at an initial state, at a time=0 hours, of the wavelength converting member is within 10%, wherein a change in a green light intensity, corresponding to an area of an emission peak measured at a wavelength of 520 nm, after 150 hours relative to the green light intensity at the initial state, at the time=0 hours, of the wavelength converting member is within 50%, wherein the change in the blue light intensity is represented by [(initial blue light intensity−blue light intensity after 150 hours)/initial blue light intensity]×100 (%)(absolute value), and wherein the change in the green light intensity is represented by [(initial green light intensity−green light intensity after 150 hours)/initial green light intensity]×100(%)(absolute value).

2. The method according to claim 1, wherein the laminate structure, which is fixed by the thermocompression bonding, includes the top film, the quantum dot layer, and the bottom film.

3. The method according to claim 1, wherein the quantum dot layer further includes a thickening agent.

4. The method according to claim 1, wherein the quantum dot layer is cured with UV curing or heat curing.

5. The method according to claim 1, further comprising:
forming the quantum dot layer from a molding or by inkjet printing.

6. The method according to claim 1, wherein the pair of rolls includes a pair of nip rolls.

7. The method according to claim 1, wherein the bottom film and the top film are sandwiched between the pair of rolls at a same timing.

8. The method according to claim 1, wherein the forming of the quantum dot layer on the bottom film includes coating the bottom film with a resin composition and evaporating a solvent in the resin composition to form the quantum dot layer, the quantum dot layer being solidified after the solvent is evaporated from the resin composition, the solvent being evaporated from the resin composition before the top film is formed on the quantum dot layer.

9. The method according to claim 8, further comprising:
dissolving an elastomer in organosilane to form the resin composition in which the quantum dots are dispersed.

10. The method according to claim 1, wherein, in the fixings, boundaries of the quantum dot layer, the bottom organic layer, and the top organic layer are fixed by the thermocompression bonding.

11. A method of producing a wavelength converting member, the method comprising:
applying a quantum dot layer including quantum dots on a bottom film, the bottom film including a bottom resin layer; and
abutting a top film on the quantum dot layer, the top film including a top resin layer;
laminating the top film, the quantum dot layer, and the bottom film so that a first adhesive layer is interposed between and directly contacts the top resin layer and the quantum dot layer and a second adhesive layer is interposed between and directly contacts the bottom resin layer and the quantum dot layer, to form a laminate structure with the bottom resin layer and the top resin layer facing the quantum dot layer; and
fixing the quantum dot layer to the bottom resin layer and fixing the quantum dot layer to the top resin layer, with the laminate structure sandwiched between a pair of rolls, by thermocompression bonding and bonding via the first adhesive layer and the second adhesive layer to bond the laminate structure at interfaces between the top resin layer and the quantum dot layer, and between the quantum dot layer and the bottom resin layer, wherein a moisture vapor rate (WVTR) of the top film and the bottom film is 0.006 $(g/m^2 \cdot day) \leq WVTR < 9$ $(g/m^2 \cdot day)$, wherein the quantum dot layer includes the quantum dots, a resin in which the quantum dots are dispersed, a dispersant, and 1 to 10 wt % of a light-scattering agent with respect to the quantum dot layer, wherein the dispersant is a material which is different from that of the resin and improves dispersibility of the quantum dots in the resin, wherein a change in an x-coordinate of a CIE color space chromaticity diagram of the wavelength converting member, under conditions of a temperature of 60° C. and a humidity of 90%, is within 5%, wherein a change in a y-coordinate of a CIE color space chromaticity diagram of the wavelength converting member, under conditions of a temperature of 60° C. and a humidity of 90%, is within 15%, wherein the change in the x-coordinate is represented by [(initial x-coordinate−x-coordinate after 200 hours)/initial x-coordinate]×100(%)(ab solute value), and wherein the change in the y-coordinate is represented by [(initial y-coordinate−y-coordinate after 200 hours)/initial x-coordinate]×100(%)(absolute value), wherein a change in a blue light intensity, corresponding to an area of an emission peak measured at a wavelength of 450 nm, after 150 hours relative to the blue light intensity at an initial state, at a time=0 hours, of the wavelength converting member is within 10%, wherein a change in a green light intensity, corresponding to an area of an emission peak measured at a wavelength of 520 nm, after 150 hours relative to the green light intensity at the initial state, at the time=0 hours, of the wavelength converting member is within 50%, wherein the change in the blue light intensity is represented by [(initial blue light intensity−blue light intensity after 150 hours)/initial blue light intensity]×100 (%)(absolute value), and wherein the change in the green light intensity is represented by [(initial green light intensity−green light intensity after 150 hours)/initial green light intensity]×100(%)(absolute value).

12. The method according to claim 11, wherein the quantum dot layer is formed with a resin composition containing first quantum dots having a first fluorescence wavelength, and second quantum dots having a second fluorescence wavelength being different from the first fluorescent wavelength.

13. The method according to claim 11, wherein the quantum dot layer further includes an adhesive component.

14. The method according to claim 11, wherein the pair of rolls includes a pair of nip rolls.

15. The method according to claim 11, wherein the applying of the quantum dot layer on the bottom film includes coating the bottom film with a resin composition and evaporating a solvent in the resin composition to form the quantum dot layer, the quantum dot layer being solidified after the solvent is evaporated from the resin composition, the solvent being evaporated from the resin composition before the top film is abutted on the quantum dot layer.

16. The method according to claim 15, further comprising:

dissolving an elastomer in organosilane to form the resin composition in which the quantum dots are dispersed.

17. The method according to claim 11, wherein, in the fixings, boundaries of the quantum dot layer, the bottom resin layer, and the top resin layer are fixed by the thermocompression bonding.

18. A method of producing a wavelength converting member, the method comprising:

forming a quantum dot layer including quantum dots on a bottom film, the bottom film including a bottom organic layer;

forming a top film on the quantum dot layer, the top film including a top organic layer;

laminating the top film, the quantum dot layer, and the bottom film, so that a first light-diffusion promoting layer, serving also as a first adhesive, is interposed between and directly contacts the top organic layer and the quantum dot layer and a second light-diffusion promoting layer, serving also as a second adhesive, is interposed between and directly contacts the bottom organic layer and the quantum dot layer, to form a laminate structure with the bottom organic layer and the top organic layer facing the quantum dot layer;

sandwiching the laminate structure between a pair of rolls to bond the laminate structure at interfaces between the top organic layer and the quantum dot layer, and between the quantum dot layer and the bottom organic layer; and fixing the laminate structure with the first light-diffusion promoting layer interposed between the quantum dot layer and the top organic layer, and the second light-diffusion promoting layer interposed between the quantum dot layer and the bottom organic layer, wherein a moisture vapor rate (WVTR) of the top film and the bottom film is 0.006 (g/m²·day)≤WVTR<9 (g/m²·day), wherein the quantum dot layer includes the quantum dots, a resin in which the quantum dots are dispersed, a dispersant, and 1 to 10 wt % of a light-scattering agent with respect to the quantum dot layer, wherein the dispersant is a material which is different from that of the resin and improves dispersibility of the quantum dots in the resin, wherein a change in an x-coordinate of a CIE color space chromaticity diagram of the wavelength converting member, under conditions of a temperature of 60° C. and a humidity of 90%, is within 5%, wherein a change in a y-coordinate of a CIE color space chromaticity diagram of the wavelength converting member, under conditions of a temperature of 60° C. and a humidity of 90%, is within 15%, wherein the change in the x-coordinate is represented by [(initial x-coordinate−x-coordinate after 200 hours)/initial x-coordinate]×100(%) (absolute value), wherein the change in the y-coordinate is represented by [(initial y-coordinate−y-coordinate after 200 hours)/initial x-coordinate]×100(%)(absolute value), wherein a change in a blue light intensity, corresponding to an area of an emission peak measured at a wavelength of 450 nm, after 150 hours relative to the blue light intensity at an initial state, at a time=0 hours, of the wavelength converting member is within 10%, wherein a change in a green light intensity, corresponding to an area of an emission peak measured at a wavelength of 520 nm, after 150 hours relative to the green light intensity at the initial state, at the time=0 hours, of the wavelength converting member is within 50%, wherein the change in the blue light intensity is represented by [(initial blue light intensity−blue light intensity after 150 hours)/initial blue light intensity]×100 (%)(absolute value), and wherein the change in the green light intensity is represented by [(initial green light intensity−green light intensity after 150 hours)/initial green light intensity]×100(%)(absolute value).

19. The method according to claim 18, wherein the forming of the quantum dot layer on the bottom film includes coating the bottom film with a resin composition and evaporating a solvent in the resin composition to form the quantum dot layer, the quantum dot layer being solidified after the solvent is evaporated from the resin composition, the solvent being evaporated from the resin composition before the top film is formed on the quantum dot layer.

20. The method according to claim 19, further comprising:

dissolving an elastomer in organosilane to form the resin composition in which the quantum dots are dispersed.

* * * * *